(12) United States Patent
Siade et al.

(10) Patent No.: US 6,909,299 B1
(45) Date of Patent: Jun. 21, 2005

(54) SYSTEM FOR TESTING MULTIPLE GROUPS OF IC-CHIPS WHICH CONCURRENTLY SENDS TIME-SHIFTED TEST SIGNALS TO THE GROUPS

(75) Inventors: Randy Neaman Siade, Chandler, AZ (US); Terry Sinclair Connacher, Scottsdale, AZ (US); James Vernon Rhodes, Chandler, AZ (US); James Mason Brafford, Mission Viejo, CA (US); John Charles Montgomery, Poway, CA (US); David Jon Mortensen, Mission Viejo, CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/705,368

(22) Filed: Nov. 10, 2003

(51) Int. Cl.[7] .............................................. G01R 31/02
(52) U.S. Cl. ...................................... 324/755; 324/760
(58) Field of Search ................................ 324/760, 765, 324/158.1, 754; 165/61–66, 80.2; 361/688, 696, 697; 439/259, 482

(56) References Cited

U.S. PATENT DOCUMENTS

| | | | | |
|---|---|---|---|---|
| 6,307,388 B1 | * | 10/2001 | Friedrich et al. ........... | 324/754 |
| 6,307,391 B1 | * | 10/2001 | Tustaniwskyj et al. ..... | 324/760 |
| 6,325,662 B1 | * | 12/2001 | Tustaniwskyj .............. | 324/754 |
| 6,415,409 B1 | * | 7/2002 | Rhodes et al. .............. | 714/738 |
| 6,522,156 B2 | * | 2/2003 | Tustaniwskyj et al. ..... | 324/754 |
| 6,581,486 B1 | * | 6/2003 | Ditri et al. .................. | 324/758 |
| 6,658,736 B1 | * | 12/2003 | Babcock et al. .......... | 29/890.03 |
| 6,774,661 B1 | * | 8/2004 | Tustaniwskyj et al. ..... | 324/765 |
| 6,809,543 B1 | * | 10/2004 | Tustaniwskyj et al. ..... | 324/765 |

* cited by examiner

Primary Examiner—Vinh Nguyen
Assistant Examiner—Jermele Hollington
(74) Attorney, Agent, or Firm—Charles J. Fassbender; Mark T. Starr; Lise A. Rode

(57) ABSTRACT

An electromechanical system for testing IC-chips includes a total of N chip holding subassemblies; a moving mechanism for automatically moving the i-th chip holding subassembly from a load position in the system to the test position in the systems, and visa-versa, where i ranges from 1 to N and changes with time in a sequence; and a signal generator which sends test signals to the IC-chips at the test position. Between the moving of the i-th chip holding subassembly and the next subassembly in the sequence, test signals are sent to the IC-chips on all N of the chip holding subassemblies such that the signals are shifted in time from one subassembly to another. Also, while the i-th chip holding subassembly is being moved, the time shifted test signals continue to be sent to the IC-chips on the remaining N–1 chip holding subassemblies.

12 Claims, 16 Drawing Sheets

|     | 24          | 23          | 22          | 21          |
|-----|-------------|-------------|-------------|-------------|
| t9  | TEST TO P2  | TEST TO P4  | TEST TO P6  | UNLOAD LOAD |
| t10 | TEST TO P3  | TEST TO P5  | TEST TO END | TEST TO P1  |
| t11 | TEST TO P4  | TEST TO P6  | UNLOAD LOAD | TEST TO P2  |
| t12 | TEST TO P5  | TEST TO END | TEST TO P1  | TEST TO P3  |
| t13 | TEST TO P6  | UNLOAD LOAD | TEST TO P2  | TEST TO P4  |
| t14 | TEST TO END | TEST TO P1  | TEST TO P3  | TEST TO P5  |
| t15 | UNLOAD LOAD | TEST TO P2  | TEST TO P4  | TEST TO P6  |
| t16 | TEST TO P1  | TEST TO P3  | TEST TO P5  | TEST TO END |

*Figure 7B*

SYSTEM FOR TESTING MULTIPLE GROUPS OF IC-CHIPS WHICH CONCURRENTLY SENDS TIME-SHIFTED TEST SIGNALS TO THE GROUPS

RELATED CASES

The present invention, as identified by the above title, is related to two other inventions which are entitled "SYSTEM FOR TESTING ONE OR MORE GROUPS OF IC-CHIPS WHILE CONCURRENTLY LOADING/UNLOADING ANOTHER GROUP" (patent application Ser. No. 10/705,524), and "SYSTEM FOR TESTING A GROUP OF IC-CHIPS HAVING A CHIP HOLDING SUBASSEMBLY THAT IS BUILT-IN AND LOADED/UNLOADED AUTOMATICALLY" (patent application Ser. No. 10/705,369). Patent applications on the present invention and the two related inventions were filed concurrently in the USPTO on Nov. 10, 2003, and they have the same Detailed Description.

BACKGROUND OF THE INVENTION

The present invention relates to electromechanical systems for testing integrated circuit. chips (IC-chips).

Typically, a single IC-chip contains between one-hundred-thousand and one-million transistors, and those transistors must be tested before the IC-chip is sold to a customer. Usually, each IC-chip is incorporated into an integrated circuit module (IC-module) before it is tested. In one type of IC-module, the IC-chip is attached to a substrate and covered with a lid. Alternatively, the lid may be left off of the IC-module. In either case, electrical terminals are provided on the substrate which are connected by microscopic conductors in the substrate to the IC-chip.

In the prior art, one method of testing IC-chips was as follows. Initially, a group of IC-modules was manually placed in respective sockets that were mounted on a printed circuit board. The printed circuit board had electrical connectors on one edge of the board; and those connectors would carry test signals, as well as DC electrical power, for the IC-chips in the. IC-modules. Several of the above printed circuit boards were provided.

After the IC-modules were placed in the sockets on all of the printed circuit boards, those printed circuit boards were manually inserted into fixed slots in an electromechanical system where the actual testing would occur. As each printed circuit board was inserted into a slot, the electrical connectors on the edge of the board would plug into mating connectors that were provided in the slot.

Usually, each slot had a vertical orientation, and all of the slots were side-by-side in a horizontal row. Multiple signal conductors were provided on a backplane in the system which extended from the connectors in the slots to a test signal generator. This test signal generator sent test signals to the IC-chips and received responses from them. Also, electrical power conductors were provided on the backplane which extended from the connectors in the slots to one or more power supplies.

Often it is desirable to perform "burn-in" tests on the IC-chips wherein the IC-chips are held at a high temperature while electrical power, with or without test signals, is applied to the IC-chips. The high temperature accelerates the occurrence of failures within the IC-chips. In the prior art, the burn-in tests were performed by enclosing the above system in an oven and providing fans in the enclosure which circulate hot air past the IC-modules.

However, one problem with the above prior art system is that the temperature at which the IC-chips are tested cannot be regulated accurately. This inaccuracy is caused, in part, by variations in the temperature and velocity if the air which flows past each of the IC-modules. Also, the inaccuracy is caused by variations in the electrical power which each IC-chip dissipates as it is being tested, and this problem gets worse as the magnitude of the power variations increase.

The above problem is overcome by another more recent prior art system for testing IC-chips which is disclosed in U.S. Pat. No. 6,307,391 by Tustaniwskyj, et al and which is entitled "Pivoting Springy Mechanism That Opens And Closes Pressed Electrical Contacts With A Force, That Is Nearly Constant Over A Range Of Closed Positions". This '391 system is comprised of "chip holding subassembly" 12, a "power converter subassembly" 13, and a "temperature regulating subassembly" 14. Multiple sets of these three subassemblies 12, 13 and 14 are held by a frame 11. All of these subassemblies are shown in the patent in FIGS. 1A–1C, and 2.

In the '391 system, the testing begins by manually removing all of the chip holding subassemblies 12 from the frame 11. Then, multiple sockets 12b on each chip holding subassembly 12 are manually loaded with a group of IC-modules. Next, all of the chip holding subassemblies 12 are manually placed back into the frame 11 such that each chip holding subassembly 12 lies between one corresponding power converter subassembly 13 and one corresponding temperature regulating subassembly 14. Then, the corresponding subassemblies 12, 13 and 14 are squeezed together by a "pressing mechanism" 15.

While the corresponding subassemblies 12, 13, and 14 are squeezed together, the IC-chips are tested. During this test, electrical power is sent to the IC-chips from the power converter subassembly 13. Also, electrical test signals may be sent to the IC-chips. In either case, the IC-chips are kept at a selectable temperature by the temperature regulating subassembly 14 which contacts the IC-modules to cool and/or heat them via thermal conduction.

After the testing of the IC-chips is complete, the pressing mechanism 15 stops squeezing the subassemblies 12, 13 and 14 together. Then, all of the chip holding subassemblies 12 are manually taken out of the frame 11, and the IC-modules are manually unloaded from the sockets 12b. Thereafter, other groups of IC-modules are tested in the same fashion.

However, a major drawback with the '391 system is that while the IC-modules are being loaded and unloaded into the chip holding subassemblies, the '391 system is not being utilized to actually test any IC-chips. Also, another drawback is that the manual loading and unloading of the IC-modules into the chip holding subassemblies is labor intensive, which is expensive and prone to error. For example, one common error is that a worker will accidentally destroy an IC-chip by failing to take proper precautions for guarding against electrostatic discharge when manually loading/unloading an IC-module from a chip holding subassembly.

To address the above utilization problem, duplicate sets of the chip holding subassemblies can be provided, and one set can be loaded/unloaded with IC-modules while the other set is being used to test IC-chips in the system. But, providing duplicate sets of the chip holding subassemblies 12 doubles their cost. In addition, the '391 system will still not be used to test IC-chips while any one set of the chip holding subassemblies 12 is put into or taken out of the frame 11.

Accordingly, a primary object of the invention which is claimed herein is to provide a novel system for testing IC-chips which overcomes one or more of the above problems.

BRIEF SUMMARY OF THE INVENTION

The invention which is claimed herein is an electromechanical system for testing IC-chips that includes the following items: 1) a total of N chip holding subassemblies, where N is an integer greater than one and where each chip holding subassembly has sockets for holding a group of IC-modules that include the IC-chips; 2) a moving mechanism for automatically moving the i-th chip holding subassembly from a load position in the system to the test position in the system, and visa-versa, where i ranges from 1 to N and changes with time in a sequence; 3) a power supply which sends electrical power only to those IC-modules that are held by each chip holding subassembly at the test position; and, 4) a signal generator which sends test signals to the IC-chips on all chip holding subassemblies that are at the test position, where the test signals are shifted in time from one subassembly to another.

In one particular embodiment, the above system has a total of four chip holding subassemblies A thru D, and the moving mechanism moves different chip holding subassemblies from the test position to the load position, and back to the test position, in the sequence A, B, C, D, A, B, C, D, etc. While the moving mechanism moves subassembly A, the signal generator sends time shifted test signals to the remaining three subassemblies B, C, and D. The test signals to subassembly B are advanced in time over the test signals to subassembly C, and the test signals to subassembly C are advanced in time over the test signals to subassembly D. When subassembly A is put back in the test position; the test signals to that subassembly begin.

Similarly, when the moving mechanism moves subassembly B from the test position to the load position, the signal generator continues to send test signals to the remaining three subassemblies C, D, and A. The test signals to subassembly C are advanced in time over the test signals to subassembly D, and the test signals to subassembly D are advanced in time over the test signals to subassembly A. When subassembly B is put back in the test position, the signals to that subassembly begin.

With the above system, a high degree of system utilization is achieved. This is because at any particular time instant, the test signals are being sent to at least three of the four chip holding subassemblies A thru D.

With the above system, the sequence in which the chip holding subassemblies are moved from the load position to the test position, and visa-versa, is a repetitive sequence. However as an alternative, the sequence can be a random sequence.

BRIEF DESCRIPTION OF THE DRAWINGS

FIG. 7B shows a continuation of the time sequence of events of FIG. 7A.

DETAILED DESCRIPTION

An electron chemical system 10 for testing IC-chips, which is one preferred embodiment of the present invention, will now be described in detail. A three dimensional view of this system 10 is shown in FIG. 1.

Figure 1:
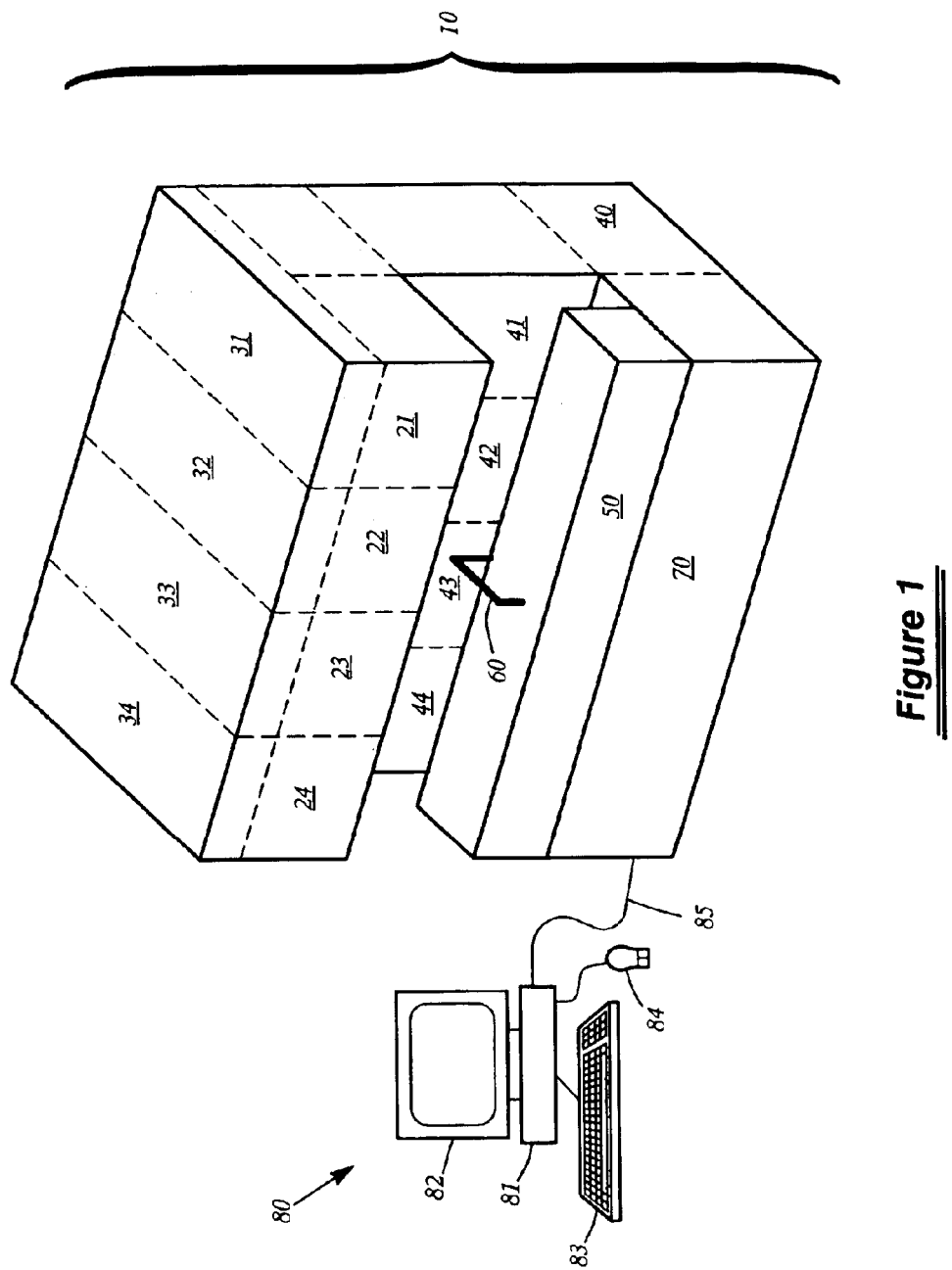
FIG. 1 shows a three dimensional view of an electromechanical system for testing IC-chips which is one preferred embodiment of the present invention.

The system 10 in FIG. 1 includes several modules which perform different functions, and those modules are identified by the following reference numerals: 21–24, 31–34, 41–44, 40, 50, 60, 70 and 80. The particular functions which each of these modules perform are described below in TABLE1.

TABLE 1

| MODULE | DESCRIPTION |
| --- | --- |
| 21 | Module 21 is a combination of three subassemblies which each perform particular functions. One subassembly holds a group of IC-chips which are to be tested. The second subassembly supplies electrical power to the above group of IC-chips while they are tested. The third subassembly sends test signals to the above group of IC-chips while they are tested. On structure for module 21 is shown in detail in FIG. 5, (which is described later). |
| 22, 23, 24 | Each of the modules 22, 23, and 24 perform the same functions, and have the same structure, as module 21. The modules 21–24 operate independently of |

TABLE 1-continued

Figure 2:
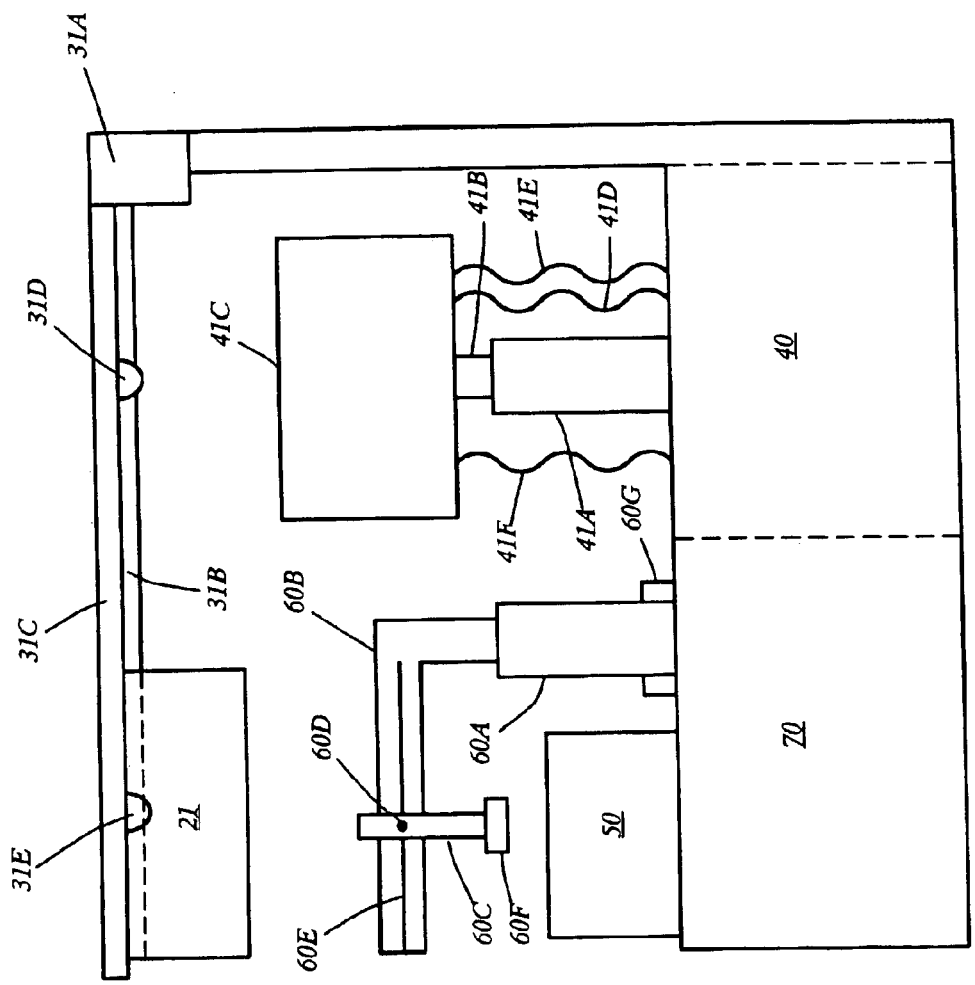
FIG. 2 shows various details of three different modules 31, 41 and 60 in the system of FIG. 1, and seen from one side of those modules.
Figure 4:
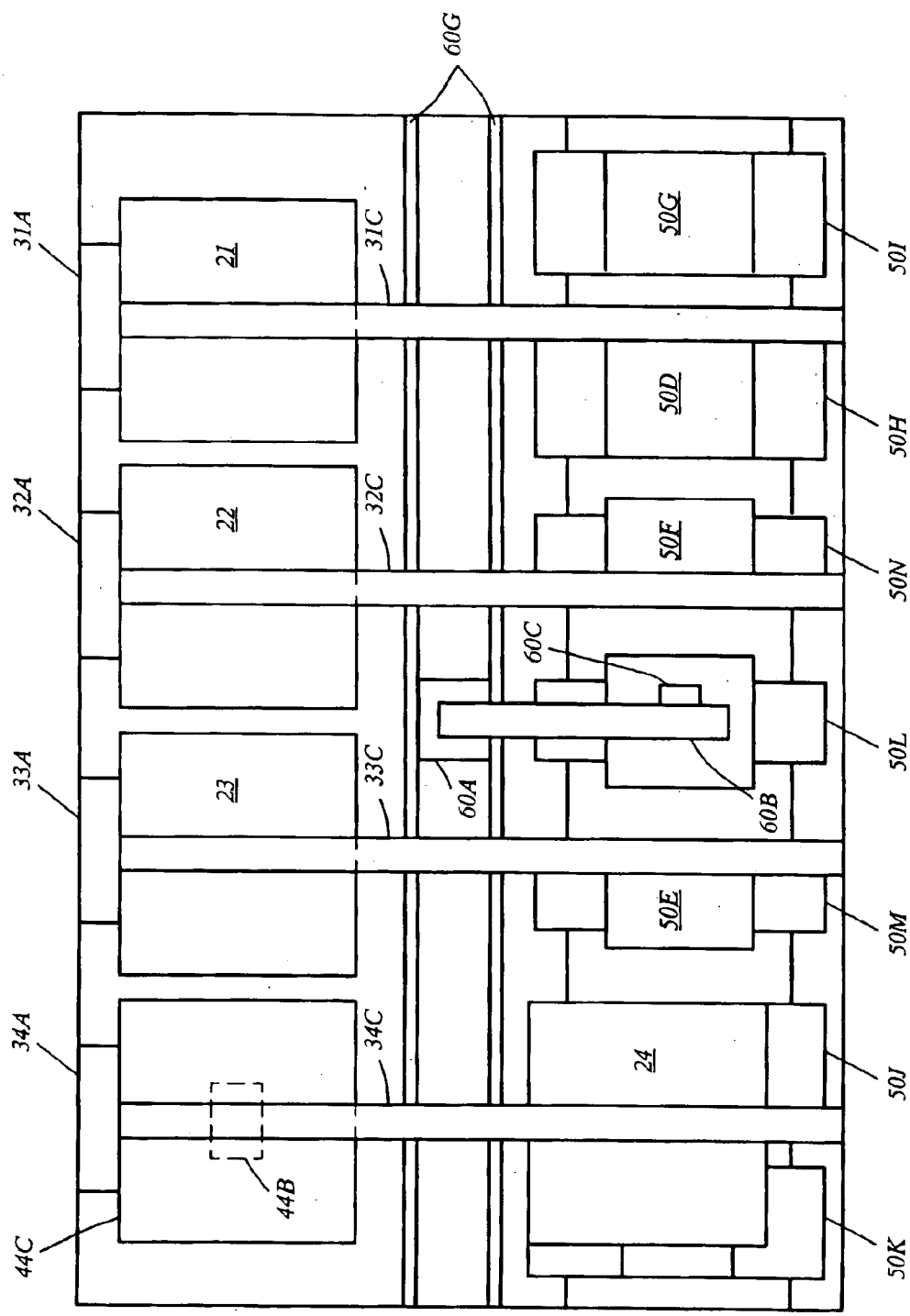
FIG. 4 shows various details of modules 21–24; 31–34, and 60 in the system of FIG. 1, as seen from the top of those modules.
Figure 6:
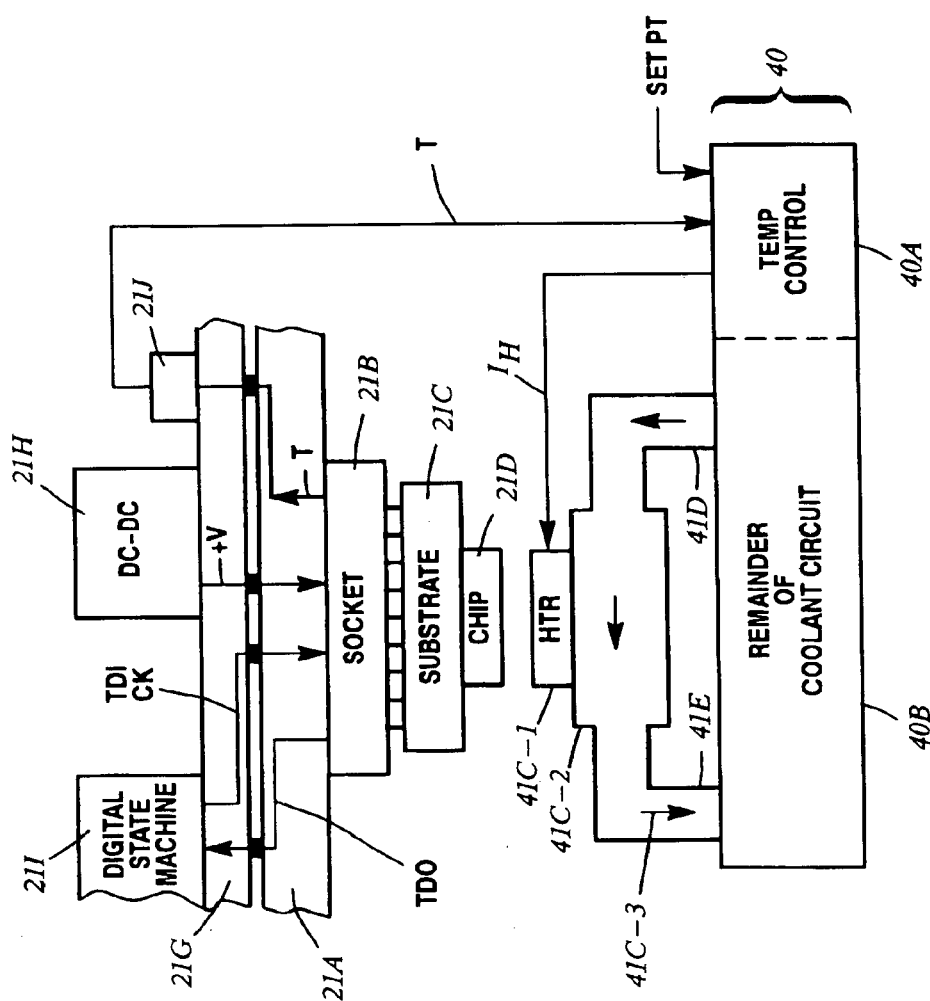
FIG. 6 shows how modules 21, 40 and 41 interact in the FIG. 1 system while any one IC-chip is tested.

| MODULE | DESCRIPTION |
|---|---|
| | each other. |
| 31 | Module 31 is a moving mechanism which automatically moves module 21 horizontally within system 10 from a load position to a test position, and visa-versa. In FIG. 1, module 21 is shown at the load position. |
| 32, 33, 34 | Modules 32, 33, and 34 are respective moving mechanisms for the modules 22, 23 and 24. Each moving mechanism operates independently to move one of the modules 22–24 horizontally within the system 10 from the load position to the test position, and visa-versa. One structure for the moving mechanisms 31–34 is shown in FIGS. 2 and 4, (which are described later). |
| 41 | Module 41 is a temperature control module for the group of IC-chips that are held by module 21. This temperature control module 41 moves vertically within the system 10 to contact the group of IC-chips that are held by module 21 when that module is in the test position. The structure of the temperature control module 41 is shown in FIGS. 2 and 6 (which are described later). |
| 42, 43, 44 | Modules 42, 43, and 44 are respective temperature control modules for the modules 22, 23, and 24. Each temperature control module moves vertically within the system 10 independently of the other temperature control modules. |
| 40 | Module 40 is a temperature control center which is shared by all of the temperature control modules 41–44. One function which the temperature control center 40 performs is to circulate a liquid coolant through each of the temperature control modules 41–44. Another function which the temperature control center 40 performs is to send control signals to each of the modules 41–44 which enable these modules to regulate the temperature of the IC-chips that they contact. |
| 50 | Module 50 is a container placing mechanism which places several different types of containers, for the IC-modules, at predetermined locations below the load position of |

TABLE 1-continued

Figure 3A:
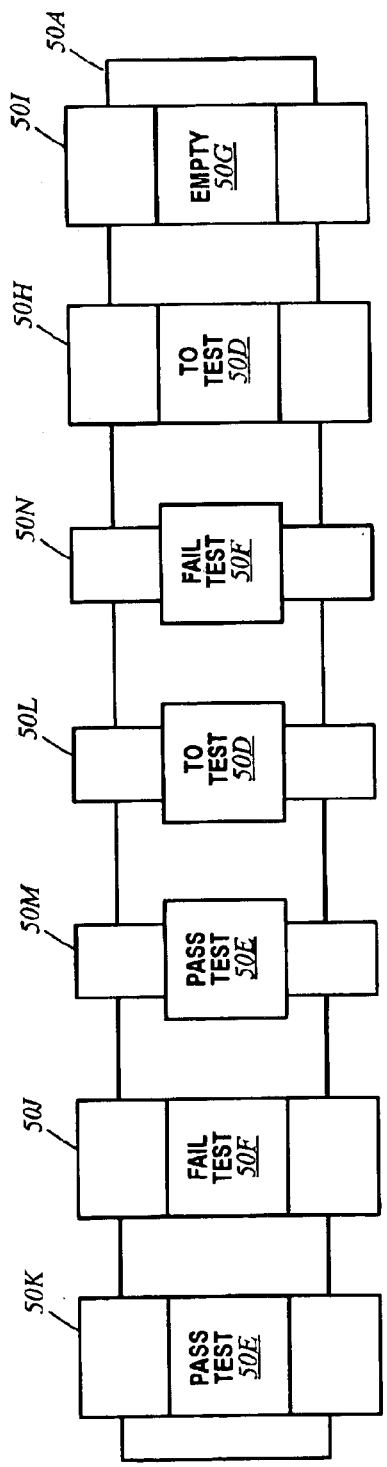
FIG. 3A shows various details of a module 50 is the system of FIG. 1, as seen from the top of that module.
Figure 3B:
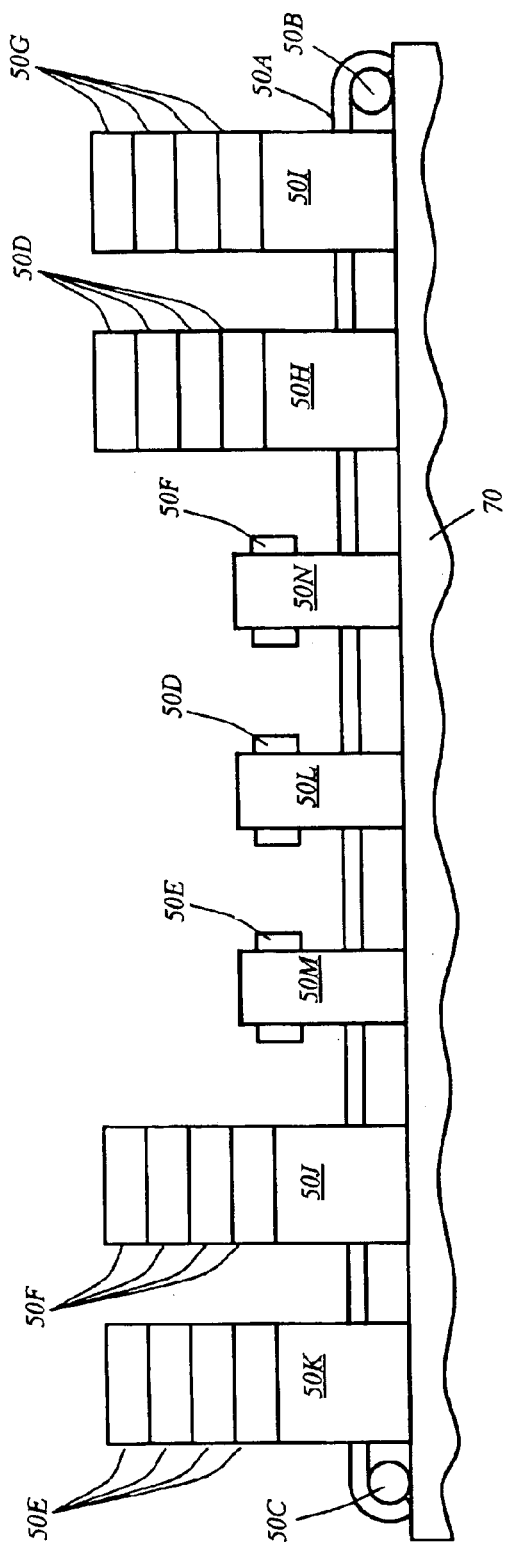
FIG. 3B shows various details of module 50 in the system of FIG. 1, as seen from the front of that module.
Figure 7A:
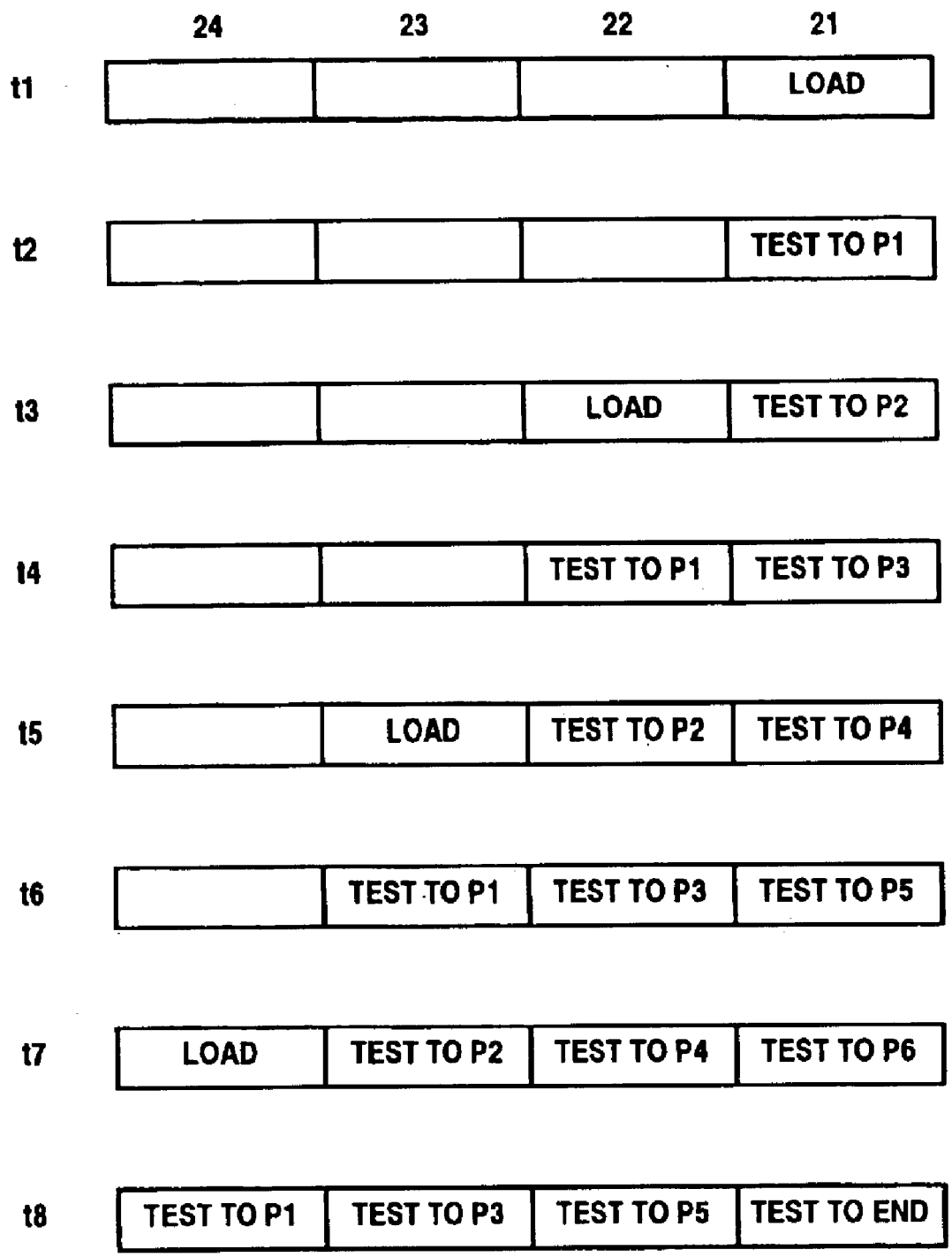
FIG. 7A shows a time sequence of events which is one example of how multiple groups of IC-chips are tested in the FIG. 1 system.

| MODULE | DESCRIPTION |
|---|---|
| | the modules 21–24. These containers include "source" containers which hold IC-chips that need to be loaded into the modules 21–24 so they can be tested, "pass" containers which hold IC-chips that have been tested and passed the test, and "fail" containers which hold IC-chips that have been tested and failed the test. The structure of the container placing mechanism is shown in FIGS. 3A–3B (which is described later). |
| 60 | Module 60 is a chip handler mechanism which automatically takes IC-modules from the source containers in module 50 and places them in each of the modules 21–24. Also, module 60 automatically takes IC-modules from each of the modules 21–24 and places them in a pass container or a fail container within module 60. The structure of the chip handler mechanism is shown in FIG. 2 (which is described later). |
| 70 | Module 70 is a master controller for the entire system 10. One function which the master controller 70 performs is to separately direct each one of the modules 31–24 when to start sending test signals to the IC-chips which those modules hold. Another function which the master controller 70 performs is to direct the chip handler mechanism 60 when the start loading IC-chips into a particular one of the modules 21–24, and when to start unloading IC-chips from those modules. Those operations are shown in FIGS. 7A and 7B, and are described in conjunction with those figures. |
| 80 | Module 80 is a human interface to the system 10. This human interface includes a microprocessor 81, a computer monitor 82, a computer keyboard 83, and a mouse 84. The microprocessor 81 is coupled via a communication channel 85 to the master controller 70. |

Next, with reference to FIG. 2, various details will be described regarding the structure of the moving mechanism 31 for module 21, the temperature control module 41 for module 21, and the chip handler mechanism 60 which automatically loads/unloads IC-modules to/from module 21. In FIG. 2, the internal components of the moving mechanism 31 are identified by reference numerals 31A–31E.

Similarly, the internal components of the temperature control module 41 are identified by reference numerals 41A–41F, and the internal components of the chip handler mechanism 60 are identified by reference numerals 60A–60G.

In the chip handler mechanism 60, component 60A is a base member, and component 60B is an arm that is carried by the base member. The base member 60A moves horizontally in a straight line in a guide 60G that lies along side of the container placing mechanism 50. The arm 60B moves vertically up and down inside of the base member 60A.

Also in the chip handler mechanism 60, component 60C is a pivot member which pivots on a pin 60D. The pin 60D is held by the arm 60B in a slot 60E, and the pin 60D together, with the pivot member 60C move in the slot. Component 60F is a vacuum chuck that is attached to one end of the pivot member 60C.

To transport an IC-module from the container placing mechanism 50 into module 21, the chip handler mechanism 60 operates as follows. First, the master controller 70 moves the base member 60A, the arm 60B, and the pivot member 60C such that the vacuum chuck 60F is in contact with on particular IC-module in the container placing mechanism 50. Then the master controller 70 causes the vacuum chuck to hold that particular IC-module by vacuum suction. Next the master controller 70 raises the arm 60B and rotates the pivot member 60C by 180°. Then the master controller 70 moves the bass member 60A, and moves the pivot member 60C in slot 60E, such that the IC-module which is held by the vacuum chuck 60F is vertically aligned within a socket inside of module 21. There the master controller moves the arm 60B upward until various I/O terminals one the IC-module are inserted into the socket. Then the master controller 70 causes the vacuum chuck 60F to release the vacuum suction.

For each IC-module that is transported from the. container placing mechanism 50 into module 21, all of the above operations are repeated. Similarly, for each IC-module that is transported from module 21 into the container placing mechanism 50, all of the above operations are repeated in reverse order.

In the moving mechanism 31, component 31A is an electric motor and component 31B is a worm gear which is rotated by the motor 31A. Also in the moving mechanism 31, component 31C is a guide along which module 21 slides. When the worm gear 31B rotates clockwise, module 21 slides to the left on the guide 31C. When the worm gear 31B rotates counter clockwise, module 21 slides to the right on the guide 31C. Further in the moving mechanism 31, component 31D is a sensor which detects when module 21 is at the test position, and component 31E is a sensor which, detects when module 21 is at the load position.

To move module 21 to the load position, the master controller 70 sends control signals to the motor 31A via conductors (not shown) which direct the motor to rotate the worm gear 31B clockwise. That rotation continues until sensor 31E detects that module 21 is at the load position. Similarly, to move module 21 to the test position, the master controller 70 sends control signals to the motor 31A which direct the motor to rotate the worm gear 31B counter clockwise. That rotation continues until sensor 31D detects that module 21 is at the test position.

In the temperature control module 41, component 41A is a base member, and component 41B is an arm that moves vertically up and down in the base member 41A. Riding on the arm 41B is a group of heat exchangers 41C. One separate heat exchanger is provided for each IC-module that is held by module 21. FIG. 6 (which is described later) shows the structure of one particular heat exchanger in the group 41C.

Also in the temperature control module 41, components 41D, is a flexible tube which carries a liquid coolant from the temperature control center 40 to the group of heat exchangers 41C. Similarly, component 41E is a flexible tube which carries the liquid coolant from the group of heat exchangers 41C back to the temperature control center 40. Further, component 41F is a set of flexible electrical conductors which carry temperature control signals for each heat exchanger in the group 41C.

In operation, all of the above components 41A–41F in the temperature control module 41 interact as follows. Initially, the arm 41B is down as shown in FIG. 2. In that down position, the group of heat exchangers 41C are lower than the bottom of module 21. This enables module 21 to be moved, by the moving mechanism components 31A–31E, from the load position to the test position.

When module 21 is moved to the test position, the arm 41B is moved upward by the temperature control center 40. This upward movement causes each heat exchanger in the group 41C to contact and press against a corresponding IC-module in module 21 with a predetermined force.

While the heat exchangers and IC-modules are pressed together, the IC-chips in the IC-modules are tested. During this test, the temperature of each IC-chip is regulated by the liquid coolant that flows through the flexible tubes 4ID–41E, and by the control signals which are carried by the conductors 41F. Additional details on this are shown in FIG. 6 (which is described later).

After the IC-chips in module 21 are tested, the arm 41B is moved downward by the temperature control center 40. Next, module 21 is moved by the moving mechanism components 31A–31E back to the load position. Then, the chip handler components 60A–60F transport each IC-module in module 21 to either a pass container or a fail container in the container placing mechanism 50. Thereafter, the chip handler components 60A–60F transport another group of IC-modules from a source container in the container placing mechanism 50 to module 21. Then, all of the above operations are repeated.

Next, with reference to FIGS. 3A–3B, various details will be described regarding the structure of the container placing mechanism 50. In FIGS. 3A–3B, the internal components of the container placing mechanism 50 are identified by reference numerals 50A–50N.

Component 50A is a conveyor belt. The top portion of the conveyor belt 50A is shown in FIG. 3A and the side of that top portion is shown in FIG. 3B. The entire conveyor belt 50A is one closed loop.

Components 50B and 50C are a pair of rollers which hold the conveyor belt 50A as shown in FIG. 3B. The rollers 50B and 50C are rotated clockwise, and counterclockwise, by an electric motor inside the master controller 70.

Each of the components 50D, 50E, 50F, and 50G is a container (such as a JEDIC tray), for holding IC-modules. The containers 50D hold IC-modules that need to be tested. The containers 50E hold IC-modules that have been tested and passed their test. The container 50F hold IC-modules that have been tested and failed their test. The containers 50G are empty.

Each of the components 50H, 50I, 50J, and 50K is a stacker/feeder mechanism. The mechanism 50H feeds the containers 50D, one container at a time, to the conveyor belt 50A. The mechanism 50I feeds the containers 50G, one container at time, to the conveyer belt 50A; and in addition, the mechanism 50I stacks the containers 50G that it receives from the conveyer belt 50A. The mechanism 50J stacks the containers 50E that it receives from the conveyer belt 50A. The mechanism 50K stacks the containers 50F that it receives from the conveyer belt 50A.

Each of the components 50L, 50M, and 50N is a lifter mechanism. The lifter mechanism 50L takes one of the containers 50D from the conveyer belt 50A and precisely lifts that container to a predetermined location above the conveyer belt. The lifter mechanism 50M takes one of the containers 50E from the conveyer belt 50A and precisely lifts that container to a predetermined location above the conveyer belt. The lifter mechanism 50N takes one of the containers 50F from the conveyer belt 50A and precisely lifts that container to a predetermined location above the conveyer belt.

Consider now how all of the components 50A–50N of FIGS. 3A–3B interact. Initially, several of the containers 50D are manually placed in the stacker/feeder mechanism 50H, and several of the containers 50G are manually placed in the stacker/feeder mechanism 50I. Then, one of the containers 50D is sent on the conveyer belt 50A from the stacker/feeder mechanism 50H to the lifter mechanism 50L. Next, one of the containers 50G is sent on the conveyer belt 50A from the stacker/feeder mechanism 50I to the lifter mechanism 50M, and another one of the containers 50G is sent on the conveyer belt 50A from the stacker/feeder mechanism 50I to the lifter mechanism 50N.

Thereafter, the chip handler mechanism 60 of FIGS. 1 and 2 takes IC-modules from the container 50D which is held by the lifter mechanism 50L, and transfers those IC-modules to module 21 in the load position. The details of how this transfer occurs was previously described in conjunction with FIG. 2. Then, module 21 is moved by the moving mechanism 31 to the test position where the IC-modules which it holds are tested. Later, when the testing of the IC-modules is complete, module 21 is moved back to the load position by the moving mechanism 21. Then, the chip handler mechanism 60 transfers the IC-modules which pass their test into the container 50B that is held by the lifter mechanism 50M, and transfers the IC-modules which fail their test into the container 50F that is held by the lifter mechanism 50N.

When the container 50E that is held by the lifter mechanism 50M becomes full, then that full container 50E is sent on the conveyer belt 50A to the stacker/feeder mechanism 50K. Thereafter, another empty container 50G is sent on the conveyer belt 50A from the stacker/feeder mechanism 50I to the lifter mechanism 50M.

Similarly, when the container 50F that is held by the lifter mechanism 50N becomes full, then that full container 50F is sent on the conveyer belt 50A to the stacker/feeder mechanism 50J. Thereafter, another empty container 50G is sent on the conveyer belt 50A from the stacker/feeder mechanism 50I to the lifter mechanism 50N.

Also, when the container 50D which is held by the lifter mechanism 50L becomes empty, then that empty container 50D is sent on the conveyer belt 50A to the stacker/feeder mechanism 50I. Thereafter, another one of the containers 50D is sent on the conveyer belt 50A from the stacker/feeder mechanism 50N to the lifter mechanism 50L.

Next, reference should be made to FIG. 4. There, a top view is shown of many of the components that were described above in conjunction with FIGS. 1, 2, 3A and 3B. All components in FIG. 4 which were previously described in conjunction with FIGS. 1, 2, 3A and 3B are identified by the same reference numeral.

In FIG. 4, most of the components 50A–50N of the container replacing mechanism 50 can be seen. All of these components are time-shared by the modules 21–24.

Similarly in FIG. 4, most of the components 60A–60G of the chip handler mechanism 60 can be seen. All of these components are also time-shared by the modules 21–24.

In FIG. 4, the modules 21, 22 and 23 are shown, at their test position, whereas the module 24 is shown at its load position. But the position of the modules 21–24 in FIG. 4 is just one illustrative example. Each of the modules 21–24 move from their test position to their load position, and visa-versa, by their respective moving mechanisms 31–34 as was previously described in conjunction with FIG. 1.

Only a few of the components in each of the moving mechanisms 31–34 can be seen in FIG. 4. However, each of the moving mechanisms 32–34 have the same structure and operation as the moving mechanism 31 which was already shown and described in detail in conjunction with FIG. 2. So to avoid repetitive and over complicating FIG. 4, only some of the components in the moving mechanisms 31–34 are shown.

For example, the guides 31C–34C in the moving mechanisms 31–34 are shown in FIG. 4. On these guides 31C–34C, the modules 21–24 respectively move from the load position to the test position, and visa-versa. Each of the guides 32C–34C respectively corresponds to guide 31C in the moving mechanism 31 of FIG. 2.

Also, the electric motors 31A–34A in the moving mechanisms 31–34 are shown in FIG. 4. These motors 31A–34A power the movement of the modules 21–24 on the guides 31C–34C. Each of the motors 32A–34A respectively corresponds to motor 31A in the moving mechanism 31 of FIG. 2.

Further in FIG. 4, only two of the components in the temperature control module 44 can be seen. One of those components is the group of heat exchangers 44C for contacting IC-modules that are held by module 24. The other component is arm 44B on which the group of heat exchangers 44C moves up and down.

No components for the temperature control modules 41–43 can be seen in FIG. 4 because they are hidden from view by the modules 21–23 which are in the test position. However, each of the temperature control modules 41–44 for modules 21–24 have the same structure and operation, and the temperature control module 41 for module 21 was previously described in detail in conjunction with FIG. 2.

Figure 5:
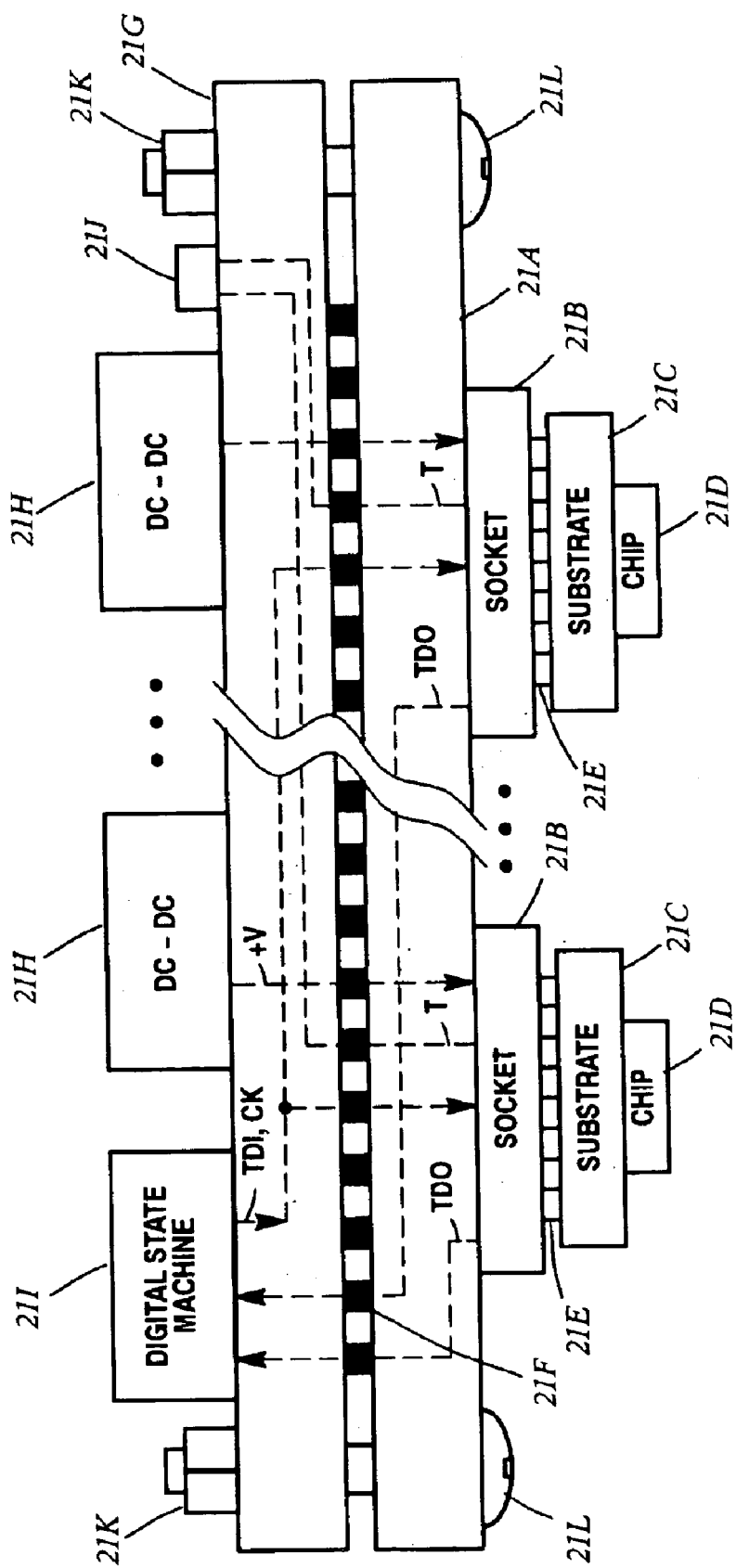
FIG. 5 shows the internal structure of module 21 in the FIG. 1 system, as seen from one side of that module.

Next, with reference to FIG. 5, various details regarding the structure and operation of module 21 will be described. In FIG. 5, the internal components of module 21 are identified by reference numerals 21A–21L.

Components 21A–21L together form three different subassemblies which each perform particular functions. The first subassembly, which is a chip holding subassembly, includes components 21A–21F. The second subassembly, which is a power supply subassembly includes components 21G–21H. The third subassembly, which is a signal generator subassembly, includes components 21I–21J and a portion of component 21G. These three subassemblies are held together as shown by a set of nuts 21K and bolts 21L.

In the chip holding subassembly, component 21A is a printed circuit board. This printed circuit board 21A lies in a horizontal plane within module 21. In FIG. 5, a side view of the printed circuit board 21A in the horizontal plane is shown, and the printed circuit board 21A extends perpendicularly into the figure.

Each of the components 21B is a socket that is mounted on the downward facing surface of the printed circuit board 21A. In one particular embodiment, a total of thirty-two sockets 21B are mounted on the printed circuit board 21A. However, the total number sockets 21B on the printed circuit board 21A is a design choice.

Each of the components 21C–21E together constitute one IC-module. Component 21C is a substrate within the IC-module; component 21D is an IC-chip that is attached to one surface of the substrate 21C; and component 21E is a set of terminals that extend from an opposite surface of the substrate 21C. The IC-modules are inserted into the sockets 21B, and are removed therefrom, by the chip-handler mechanism 60 as was previously described in conjunction with FIG. 2.

Each of the components 21F is a springy electrical contact on the upward facing surface of the printed circuit board 21A. These contacts 21F are electrically connected to the IC-chips 21D by the conductors that run through the printed circuit board 21A, the sockets 21B, and the substrates 21C.

Some illustrative examples of the conductors in the printed circuit board 21A as shown in FIG. 5 by dashed lines. The symbol "+V" next to a dashed line indicates that the corresponding conductor carries electrical power at a constant voltage +V to the IC-chip 21D. The symbols "TDI, CK" next to a dashed line indicates that the corresponding conductor carries "TEST DATA IN" signals and "CLOCK" signals to an IC-chip 21D. The symbol "TDO" next to a dashed line indicates that the corresponding conductor carries "TEST DATA OUT" signals from the IC-chip 21D. The symbol "T" next to a dashed line indicates that the corresponding conductor carries a signal from a temperature sensor on one IC-chip 21D which measures the chips' temperature.

In the power supply subassembly, component 21G is a printed circuit board. This printed circuit board 21G is aligned with the printed circuit board 21A in the chip holding subassembly, as shown. The printed circuit board 21G includes electrical conductors which connect to the spring electrical contacts 21F, and some illustrative examples of those conductors are shown in FIG. 5 by dashed lines.

Each of the components 21H is a DC—DC converter that is mounted on the upward facing surface of the printed circuit board 21G. In the FIG. 5 embodiment, one separate DC—DC converter 21H is provided for each IC-chip 21D. These DC—DC converters 21H receive electrical power at an input voltage $V_{IN}$ from a power cable (not shown) and they produce electrical power at the voltage +V which is sent to the IC-chips 21D.

In the signal generator subassembly, component 21I is a multi-function digital state machine. One function which the state machine 21I performs is generate the CLOCK signals CK. A second function which the state machine 21I performs is generated the TEST DATA IN signals TDI in synchronization with the CLOCK signals CK. A third function which the state machine 21I performs is receive the TEST DATA OUT signals TDO and compare them to an expected result. If the TEST DATA OUT signals match the expected result, then the IC-chip 21D which sent the TEST DATA OUT signals passes its test. Otherwise, the IC-chip 21D which sent the TEST DATA OUT signals fails its test.

The state machine 21I is coupled to the master controller 70 of FIG. 1 by a communication channel (not shown). The master controller 70 sends control messages over the communication channel to the state machine. 21I which direct it to start sending the CLOCK signals CK and the TEST DATA IN signals TDI. Thereafter, the state machine 21I sends return messages over the communication channel to the master controller 70 which identify all of the IC-chips 21D in the sockets 21D that passed their test, and identify all of the IC-chips 22D in the sockets 21B that failed their test.

Component 21J is an electrical connector. This connector 21J receives a respective temperature signal T from each of the IC-chips 21D that are held by the sockets 21B. All of the temperature signals T are sent from the socket 21J to the temperature control center 40 on a cable (not shown).

Throughout the above description of all of the components 21A–21J in FIG. 5, those components were described as being in module 21. However, all of the modules 21–24 are identical in structure and operation to each other. Thus, what is described above with regard to components 21A–21J in FIG. 5 applies to each of the modules 21–24.

Next, with reference to FIG. 6, additional details will be described on how the temperature of the IC-chips 21D are regulated while they are tested. In FIG. 6 the components which are identified by reference numerals 21A–21D and 21G–21I are the same components that were described above in conjunction with FIG. 5 . For example, component 21D is one IC-chip that is being tested.

Also in FIG. 6, the components which are identified by reference numerals 41C-1 and 21C-2 are inside of the group of heat exchangers 41C that is shown in FIG. 2. More specifically, components 41C-1 and 41C-2 comprise one of the heat exchangers in the group. All of the heat exchangers have the same structure, so only one is shown in FIG. 6.

Component 41C-1 is a thin flat electric heater. The top surface of this electric heater 41C-1 contacts and presses against the IC-chip 21D while the IC-chip is held by module 21 in the test position.

Component 41C-2 is a hollow cooling jacket which is attached to the bottom surface of the electric heater 41C-1. A liquid coolant 41C-3 flows through the cooling jacket 41C-2. The liquid coolant travels to and from the cooling jacket 41C-2 through the flexible tubes 41D and 41E that were described above in conjunction with FIG. 2.

Further shown in FIG. 6 is a temperature control circuit 40A. This circuit 40A lies within the temperature control center 40 that is seen in FIGS. 1 and 2. Only one circuit 40A is shown in FIG. 6, but a separate copy of that circuit is provided in the temperature control center 40 for each IC-chip 21D in each of the modules 21–24.

In operation, the temperature control circuit 40A receives two input signals "SET-POINT" and "TEMP", and in response generates an output current "$I_H$" for the electric heater 41C-1. The signal SET-POINT indicates a temperature at which the IC-chip 21C is to be maintained. This signal is sent from the master controller 70 in FIG. 1. The signal TEMP indicates the actual temperature of the IC-chip 21C. This signal is sent from a temperature sensor inside the IC-chip 21C through the substrate 21C and socket 21B.

If the actual temperature of the IC-chip 21C (as indicated by the TEMP signal) is more than the SET-POINT temperature, then the temperature control circuit 40A decreases the magnitude of the current $I_K$ to the electric heater 41C-1. Conversely, if the actual temperature of the IC-chip 21C is less than the SET-POINT temperature, then the temperature control circuit 40A increases the magnitude of the current $I_H$ to the electric heater 41C-1.

Next, with reference to FIGS. 7A–7B, one particular time sequence of events will be described which illustrates how the IC-chips in all of the modules 21–24 are concurrently loaded, tested, and unloaded. Initially, in time period t1 in FIG. 7A, one group of IC-modules 21C–21E are loaded into the sockets 21B inside of module 21. This loading occurs while module 21 is at the load position. The loading is performed by the chip handler mechanism 60 and the container placing mechanism 50 as was described previously in conjunction with FIGS. 2–4.

Thereafter, in time period t2, the testing of the IC-chips 21C in module 22 begins. To do that, module 21 is first moved horizontally from the load position to the test position. This is done by the moving mechanism 31. When module 21 reaches the load position, the temperature control module 41 moves vertically upward until the electric heaters 41C-1 in module 41 press against the IC-chips 21D in module 21. Then the IC-chips 21D in module 21 are sent electrical power by the DC—DC converters 21H, are sent CK and TDI signals by the digital state machine 21I, and have their temperature regulated by modules 40 and 41.

The above testing of the IC-chips in module 21 proceeds in a continuous and uninterrupted fashion until it is completed. In the sequence of FIGS. 7D–7B, this testing reaches a point P1 at the end of time period t2. Later, at the end of time period t3, this testing reaches a point P2. Thereafter, at the end of time period t4, this testing reaches a point P3. At the end of time period t8, the testing of the IC-chips 21D in module 21 reaches completion.

Meanwhile, back in time period t3 in FIG. 7A, a second group of IC-modules is loaded into the sockets inside of module 22. This loading occurs while module 22 is at the load position. The loading is performed by the chip handler mechanism 60 and the container placing mechanism 30.

Thereafter, in time period t4, the testing of the IC-chips in module 22 begins. To do that, module 22 is first moved horizontally from the load position to the test position. This is done by the moving mechanism 32. When module 22 reaches the load position, the temperature control module 42 moves vertically upward until the electric heaters in module 42 press against the IC-chips in module 22. Those IC-chips are then sent electrical power by the DC—DC converters in module 22, are sent CK and TDI signals by the digital state machine in module 22, and have their temperature regulated by modules 40 and 42.

The above testing of the IC-chips in module 22 proceeds in a continuous and uninterrupted fashion until it is completed. In the sequence of FIGS. 7A–7B, this testing reaches a point P1 at the end of time period t4. Later, at the end of time period t5, this testing reaches a point P2. At the end of time period t10, the testing of the IC-chips in module 22 reaches completion.

Similarly, back in time period t5 in FIG. 7A, a third group of IC-modules is loaded into the sockets inside of module 23. This loading occurs while module 23 is at the load position. The loading is performed by the chip handler mechanism 60 and the container placing mechanism 50.

Thereafter, in time period t6, the testing of the IC-chips in module 23 begins. To do that, module 23 is first moved horizontally from the load position to the test position. This is done by the moving mechanism 33. When module 23 reaches the load position, the temperature control module 43 moves vertically upward until the electric heaters in module 43 press against the IC-chips in module 23. Those IC-chips are then sent electrical power by the DC—DC converters in module 23, are sent CK and TDI signals by the digital state machine in module 23, and have their temperature regulated by modules 40 and 43.

Th above testing of the IC-chips in module 23 proceeds in a continuous and uninterrupted fashion until it is completed. In the sequence of FIGS. 7A–7B, this testing reaches a point P1 at the end of time period t6. Later, at the end of time period t7, this testing reaches a point P2. At the end of time period t12 the testing of the IC-chips in module 23 reaches completion.

In like fashion, back in time period t7 in FIG. 7A, a fourth, group of IC-modules is loaded into the sockets inside of module 24. This loading occurs while module 24 is at the load position. The loading is performed by the chip handler mechanism 60 and the container placing mechanism 50.

Thereafter, in time period t8, the testing of the IC-chips in module 24 begins. To do that, module 24 is first moved horizontally from the load position to the test position. This is done by the moving mechanism 34. When module 24 reaches the load position, the temperature control module 44 moves vertically upward until the electric heaters in module 44 press against the IC-chips in module 24. Those IC-chips are then sent electrical power by the DC—DC converters in module 24, are sent CK and TDI signals by the digital state machine in module 24, and have their temperature regulated by modules 40 and 44.

The above testing of the IC-chips in module 24 proceeds in a continuous and uninterrupted fashion until it is completed. In the sequence of FIGS. 7A–7B, this testing reaches a point P1 at the end of time period t8 Later, at the end of time period t9, this testing reaches a point P2. At the end of time period t14, the testing of the IC-chips in module 24 reaches completion.

When the testing of a group of IC-chips is any one of the modules 21–24 reaches completion, then that group of IC-chips is unloaded and a new group of IC-chips is loaded. Each occurrence of this event is indicated by the term "UNLOAD LOAD" in FIGS. 7A–7B.

To perform the above UNLOAD LOAD operation on any particular one of modules 21–24, that module is first moved by its respective moving mechanism 31–34 from the test position to the load position. Then the actual unloading one group of IC-chips, and loading of a new group of IC-chips, is performed by the chip handler mechanism 60 and container placing mechanism 50.

After the new group of IC-chips is loaded into any one of the modules 21–24, then the testing of those IC-chips begins. In the sequence of FIGS. 7A–7B, the testing of a new group of IC-chips begins in the modules 21, 22, 23, and 24, during time periods t10, t12, t14, and t16 respectively.

In FIGS. 7A–7B, the time periods that are shown end at t16. However, the sequence of events which are illustrated during the time periods t9–t16 can be repeated as many times as desired.

For example, during the first repetition, the time periods would be t17–t24. The events which occur in time period t17 are same as the events which are in time period t9; the events which occur in time period t18 are same as the events which occur in time period t10; etc.

When the events which are shown in the time periods t9–t16 are repeated multiple times, the IC-chips in all of the modules 21–24 are sent the same TEST DATA IN signals TDI. However, those TDI signals are shifted in time from one module to another.

For example, when IC-chips are being unloaded from module 21, the TDI signals to the IC-chips in module 22 are advanced in time over the TDI signals to the IC-chips in module 23, and the TDI signals to the IC-chips in module 23 are advanced in time over the TDI signals to the IC-chips in module 24. Later, when IC-chips is being unloaded from module 22, the TDI signals to the IC-chips in module 23 are advanced in time over the TDI signals to the IC-chips in module 24, and the TDI signals to the IC-chips in module 24 are advanced in time over the TDI signals to the IC-chips in module 21.

With the IC-chip testing system of FIGS. 1–7B, one major benefit which is obtained is a high degree of system utilization. This benefit is seen from inspection of FIGS. 7A–7B which shows, that in any one particular time interval tl7–t24, and the corresponding repeated time intervals, IC-chips are being tested in at least three of the four modules 21–24, concurrently.

Also, with the IC-chip testing system of FIGS. 1–7B, the above high degree of system utilization is obtained without needing duplicate sets of the modules 21–24. This is in comparison to the prior art '391 chip testing system which was discussed in the BACKGROUND, wherein duplicate chip holding subassemblies are needed to reduce unused system time while one group of IC-chips is unloaded from the system and another group is loaded.

Further with the IC-chip testing system of FIGS. 1–7B, all loading of the IC-chips into the modules 21–24, and all unloading of the IC-chips from those modules, is performed automatically by the chip handler mechanism 60 and the container placing mechanism 50. This completely avoids the manual loading and manual unloading of the IC-chips that occurs in the prior art '391 system. Such manual operations are labor intensive and prone to error.

An electromechanical system for testing IC-chips, which is one preferred embodiment of the present invention, has now been described in detail. Now, several modifications to that embodiment will be described.

Figure 8:
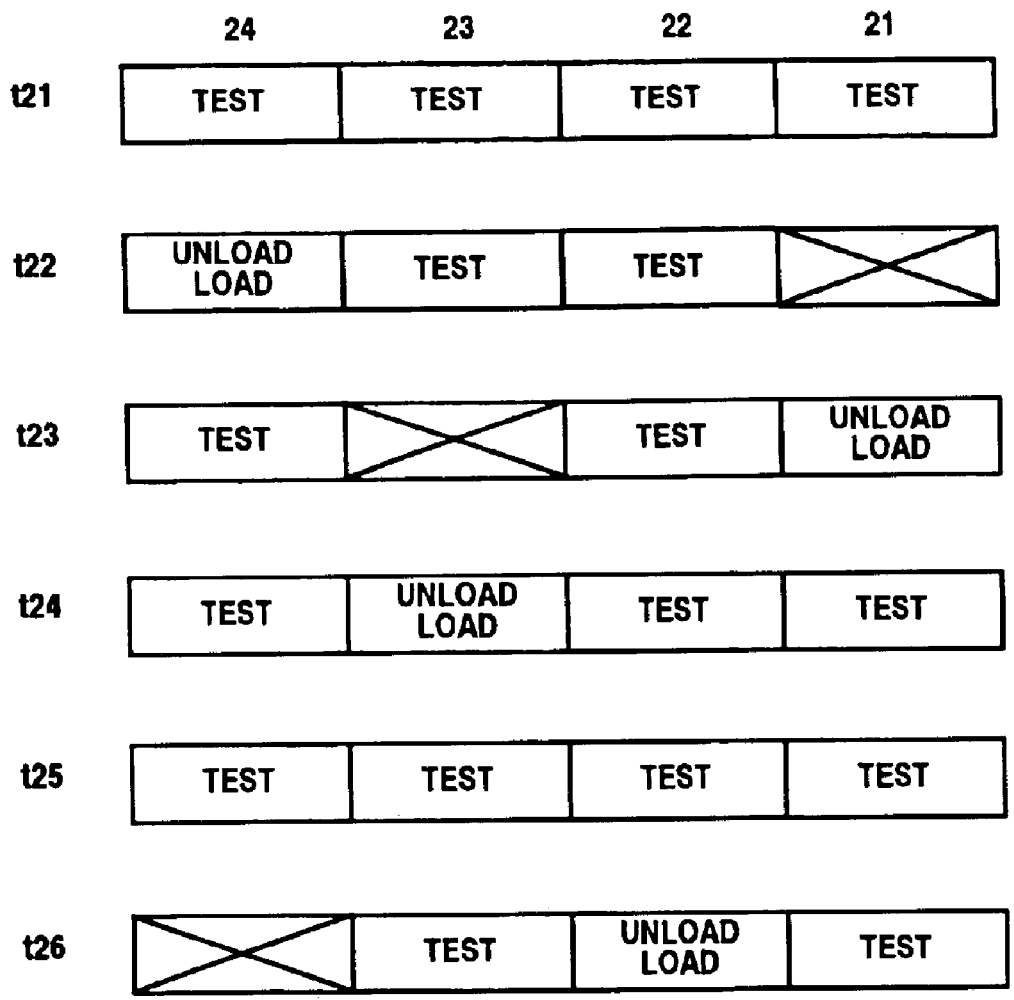
FIG. 8 shows another time sequence of events which is a second example of how multiple groups of IC-chips are tested in the FIG. 1 system.

The first modification is illustrated in FIG. 8. That figure is similar to FIGS. 7A and 7B in that they each show a time sequence of events in which the IC-chips in all of the modules 21–24 are concurrently loaded, tested and unloaded.

Inspection of FIG. 8 shows that the testing of the IC-chips and the unloading/loading of the IC-chips in the modules 21–24 occurs in a random sequence. This is in comparison to FIG. 7B where the testing of the IC-chips and the unloading/loading of the IC-chips in the modules 21–24 occurs in a repetitive sequence.

In FIG. 8, the illustrated sequence of events is shown for only a few time intervals t2l–t26. However, the events that are shown in FIG. 8 continue as long as desired in a random order.

With the random sequence of FIG. 6, a high degree system utilization is still obtained. This benefit is seen by simply calculating the average number of modules 21–24 which are testing IC-chips during all of the time internals t21–t26. That average number is 17÷6 or 2.83 modules per time interval, out of a total of four modules 21–24.

Next, a second modification will be described with reference to FIG. 9. There, a system for testing IC-chips is shown which is a greatly simplified version of the FIG. 1 system. More specifically, in the FIG. 9 system, all of the modules 22–24, 32–34, and 42–44 from the system of FIG. 1 have been eliminated, and only one group of IC-chips is tested at a time by the modules 21, 31 and 41.

Figure 9:
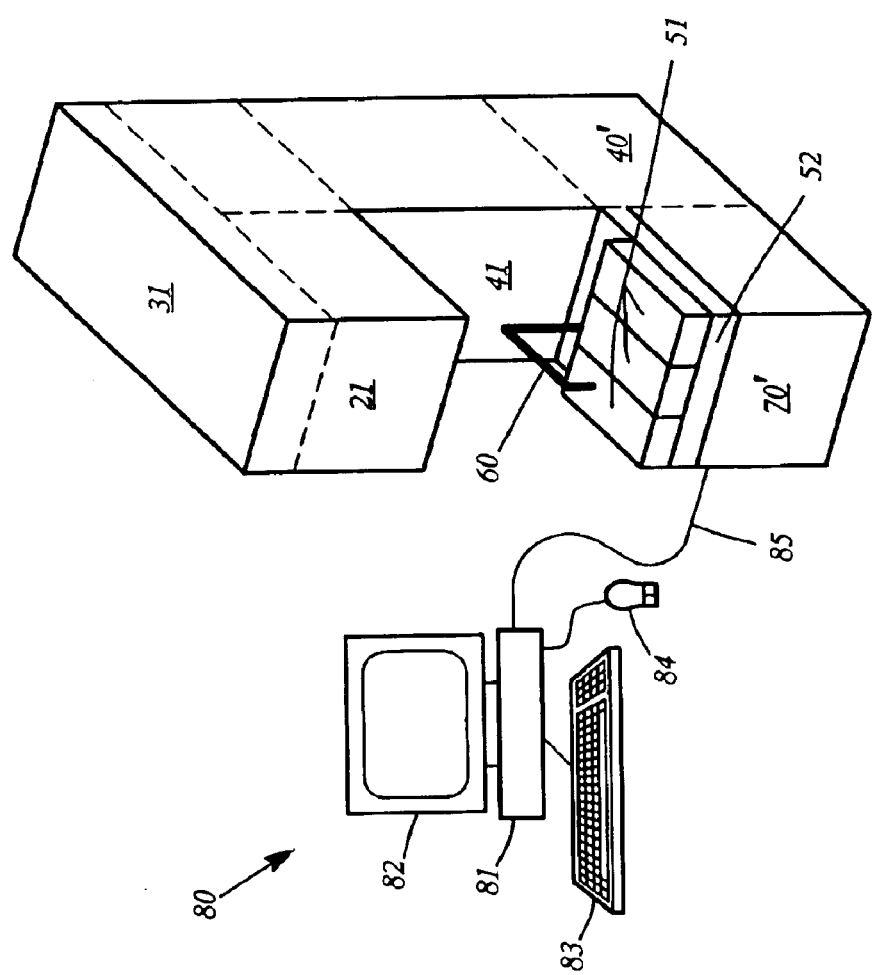
FIG. 9 shows one modification which can be made to the FIG. 1 system.

To accommodate the above change, the FIG. 9 system includes a modified temperature control center 40', and a modified master controller 70'. The modified temperature control center 40' is the same as the temperature control center 40 in FIG. 1 except that it is simplified to only operate with module 41, rather than modules 41–44. Similarly, the modified master controller 70' is the same as the master controller 70 in FIG. 1 except that it is simplified to only operate with module 41, rather than modules 41–44.

Further to accommodate the above change, the container placing mechanism 50 from the FIG. 1 system is eliminated and replaced with components 51 and 52. Each of the components 51 is a container for holding several of the IC-modules 21C–21E from FIG. 5. The central container 51 holds IC-modules that need to be tested; the left most container 51 holds IC-modules that passed their test; and the right most container 51 holds IC-modules that failed their test.

All three containers 51 are held stationary by a base 52. An operator manually replaces the central container 51 when it is emptied by the chip handler mechanism 60, and manually replaces the other containers 51 when they are filled by the chip handler mechanism 60.

With the system of FIG. 9, tests are performed on multiple groups of IC-chips, one group at a time, without ever handling the IC-chips manually. This feature is achieved by automatically moving module 21 back and forth between the load position and the test position inside of the system. At the load position, the chip handler mechanism 60 automatically unloads one group of IC-modules from the sockets 21B in module 21 and automatically loads another group of the IC-modules into those sockets. At the test position, electrical power is sent to the IC-chips 12D by the DC—DC converters 21H; test signals are sent to the IC-chips 12D by the state machines 21I; and the temperature control module 41 engages the IC-chips to thereby control their temperature by thermal conduction. Due to the above operation, the testing of the IC-chips is not labor intensive and not prone to operator error.

Next, a third modification will be described with reference to FIG. 10. There, a system for testing IC-chips is shown which is the same as the above described system of FIG. 9 except that in the FIG. 10 system, the container replacing mechanism 50 from the system of FIG. 1 is retained.

Figure 10:
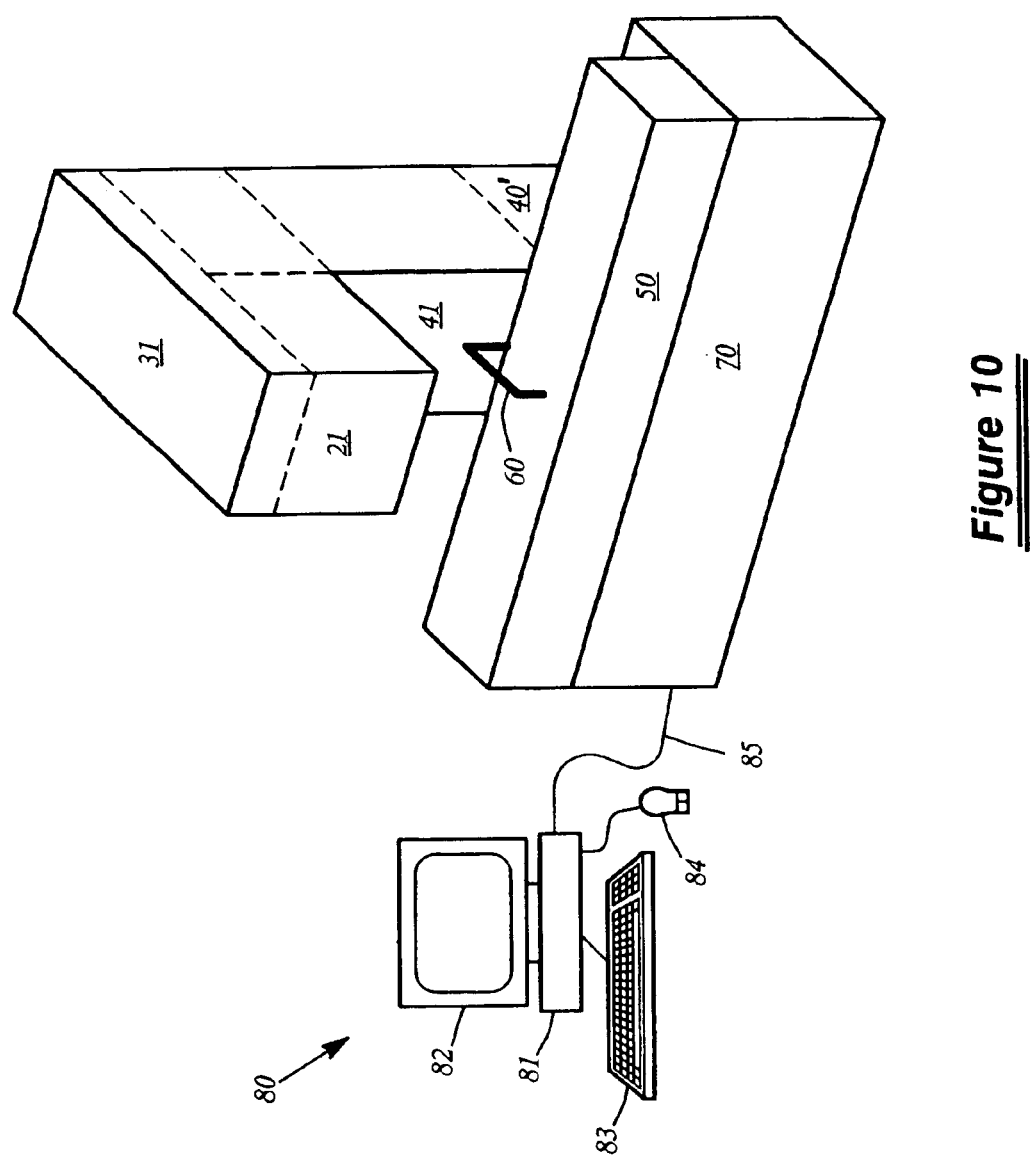
FIG. 10 shows a second modification which can be made to the FIG. 1 system.

The container replacing mechanism 50 in the FIG. 10 system includes all of the components 50A–50N which are shown in FIGS. 3A–3B and which were previously described in conjunction with those figures. With that container replacing mechanism 50, the IC-chips which need to be tested are automatically presented to the chip handler mechanism 60 by the stacker/feeder 50H, the conveyor belt 50A, and lifter 50L. Also, the IC-chips which have been tested are automatically taken from the chip handler mechanism 60 by the lifters 50M–50N, the conveyor belt 50A, and the stacker/feeders 50J–50K.

Figure 11:
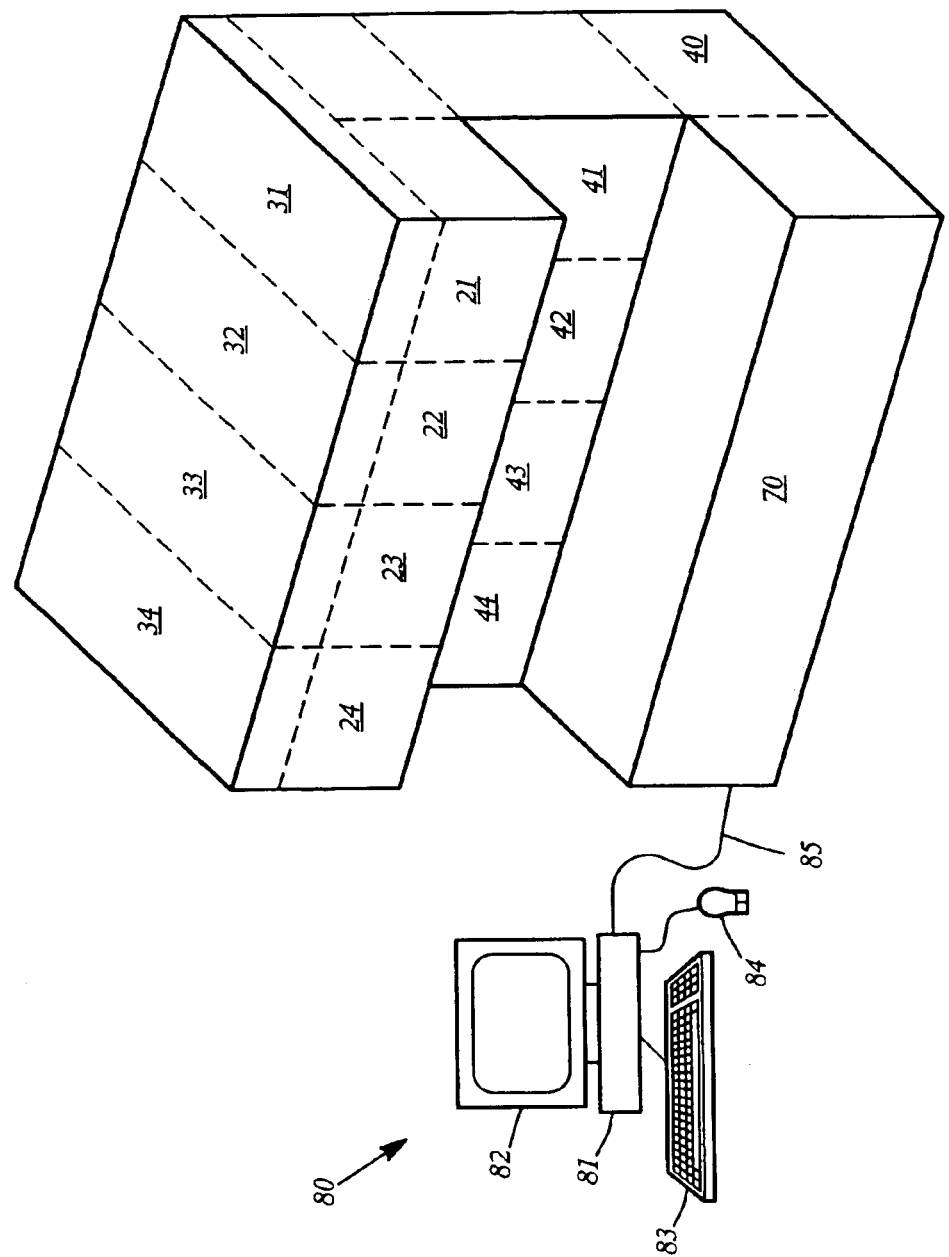
FIG. 11 shows a third modification which can be made to the FIG. 1 system.
Figure 12:
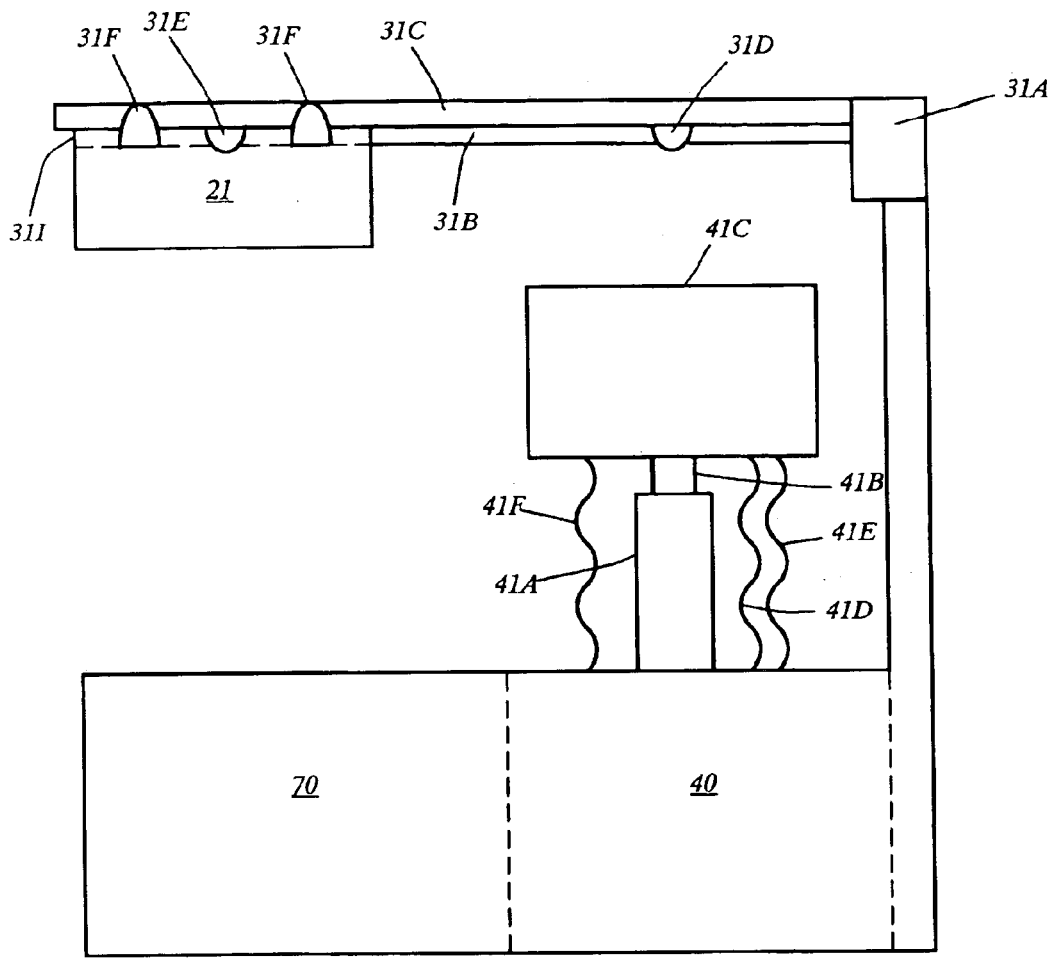
FIG. 12 shows the modification of FIG. 11 as seen from one side of the modified system in FIG. 11.

Next, a fourth modification will be described with reference to FIGS. 11–13. In FIGS. 11 and 12, a system for testing IC-chips is shown which includes all of the modules that are in the system of FIG. 1, except for the container replacing mechanism 50 and the chip handler mechanism 60.

To accommodate the above change, each of the modules 21–24 is manually removable from the system of FIGS. 11 and 12 while those modules are at the load position. After any one of the modules 21–24 is taken out of the system, the group of the IC-chips which are held by the sockets in the module is manually replaced with a new group of IC-chips. Then, that new group of IC-chips is tested by manually returning the module 21–24 back into the system.

Figure 13:
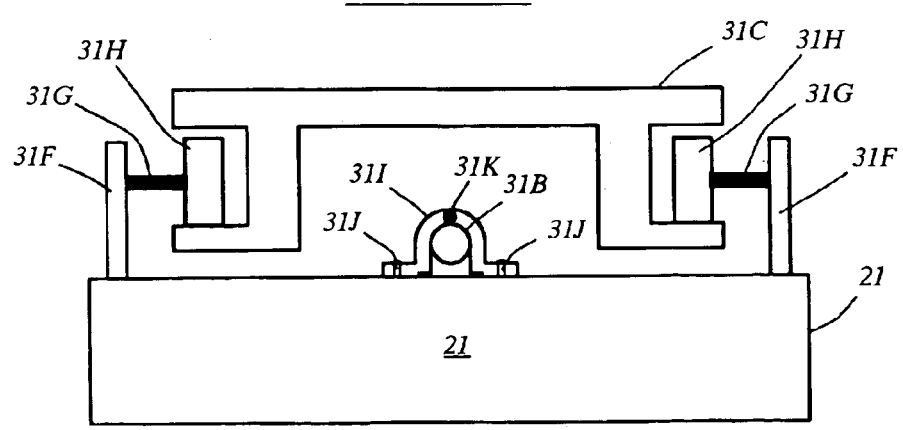
FIG. 13 shows additional details of module 31 in the modified system of FIG. 12.

A mechanism which enables module 21 to be manually taken out of the system, and manually returned to the system, is shown in FIG. 13. That same mechanism is replicated on each of the modules 22–24 so that they can also be manually taken out, and returned to, the system of FIGS. 11–12.

Component 31C in FIG. 13 is the guide which was previously shown in FIG. 2 and which is shown again in FIG. 12. The guide 31C is viewed from one side in FIGS. 2 and 12, and is viewed from the one end in FIG. 13.

Component 31B in FIG. 13 is the worm gear which was previously shown in FIG. 2 and which is shown again in FIG. 12. The worm gear 31B is viewed from one side in FIGS. 2 and 12, and is viewed from one end in FIG. 13.

Components 31F–31K couple module 21 to the guide 31C and the worm gear 31B in a manually removable fashion. Each of the components 31F is a support that extends vertically upward from module 21; each of the components 31G is an axle that extends horizontally from one of the supports 31F; and each of the components 31H is a wheel that rotates on one of the axles 31G. Two of the supports 31F, together with their axle 31G and wheel 31H, are provided on each side of the module 21.

Component 31I is a bracket which has the shape of an up-side-down "U". The two ends of the bracket 31I are attached to module 21 with a pair of pins 31J. The center of bracket 31I has a downward projection 31K which fits between the threads of the worm gear 31B.

To remove module 21 from the system of FIGS. 11–12, that module is first moved automatically to the load position. Then, an operator manually removes the pins 31J from the bracket 31J. Next the operator manually lifts the bracket 31J off of the worm gear 31B. Then the operator slides module 21 on the wheels 31H off of the end of the guide 33C. To reinstall module 21 back into the system of FIGS. 11–12, the above steps are simply performed in reverse order.

With the system of FIGS. 11–12, a high degree of system utilization is obtained. This is because with the system of FIGS. 11–12, the time sequence of events which is shown in FIGS. 7A, 7B and 8 (which was previously described) still occurs. However with the system of FIGS. 11–12, each "unload/load" operation that is shown in FIGS. 7A, 7B and 8 is performed manually.

Next, a fifth modification will be described with reference to FIG. 14. There, a system for testing IC-chips is shown which is the same as the above described system of FIGS. 11–12 except that in the FIG. 14 system, all of the temperature control nodules 41–44 and the temperature control center 41 have been deleted.

Figure 14:
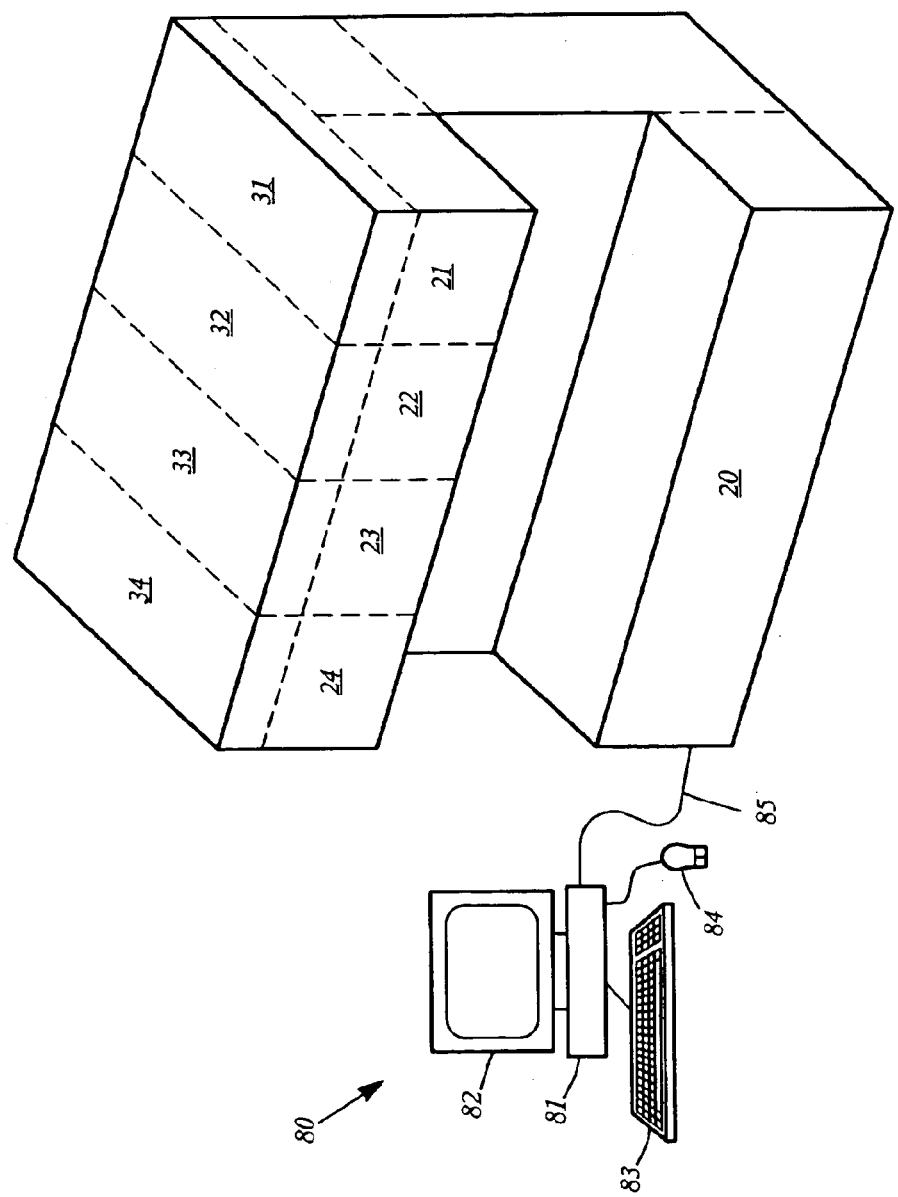
FIG. 14 shows a fourth modification which can be made to the FIG. 1 system.

The system of FIG. 14 is used to test particular types of IC-chips which have such a low power dissipation that they do not need to be physically contacted by any heat exchanger during the test. Instead, if the power dissipation of an IC-chip is sufficiently low, that IC-chip can be tested while it is simply exposed to the surrounding air.

With the system of FIG. 14, a high degree of system utilization is again obtained. This is because with the system of FIG. 14, the time sequence of events which is shown in FIGS. 7A, 7B and 8 still occurs. In addition, with the system of FIG. 14, the cost of the temperature control modules 41–44 and the temperature control center 40 is eliminated.

Next, a sixth modification will be described with reference to FIG. 15. There, a modified structure for module 21 is shown: The structure for module 21 in FIG. 15 is the same as structure for module 21 which is shown in FIG. 5 (which was previously described) except that in FIG. 15, the state machine 21I and the conductors which carry the TDI, CK and TDO signals are eliminated.

Figure 15:
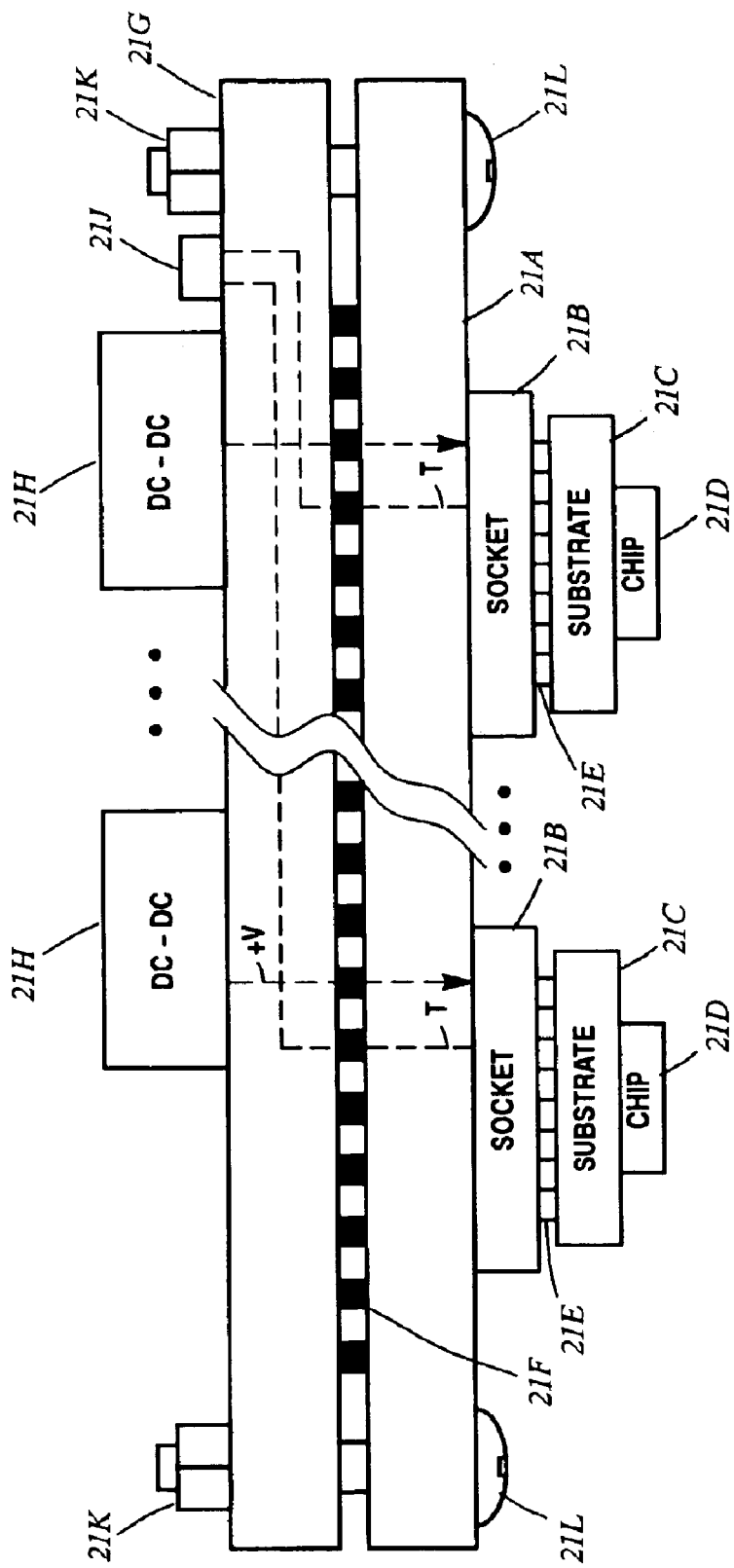
FIG. 15 shows a modification to module 21 of FIG. 5 which can be incorporated into the system of FIGS. 1, 9, 10, 11, 12 and 14.

The modified module 21 which is shown in FIG. 15 can be incorporated into the system of FIG. 9 and into the system of FIG. 10. Further, each of the modules 21–24 can have the same modified structure that is shown in FIG. 15, and those modified modules can be incorporated in the system of FIG. 1, the system of rig. 11, and the system of FIG. 14.

With the modified module of FIG. 15, "burn-in" tests on the IC-chips 21D can be performed. During these tests, electrical power is applied to the IC-chips 21D by the DC—DC converters 21H. At the same time, the IC-chips 21D can be maintained at a high temperature by the modules 41–44 to thereby accelerate the occurrence of failures inside of the IC-chips.

Next, a seventh modification will be described with reference to FIG. 16. There, a modified structure for module 60 is shown. The structure for module 60 in FIG. 16 is the same as the structure for module 60 which is shown in FIG. 2 (which has previously described) except that in FIG. 16, components 60H and 60I are added, and components 60C' and 60F' are modified versions of components 60C and 60F.

Figure 16:
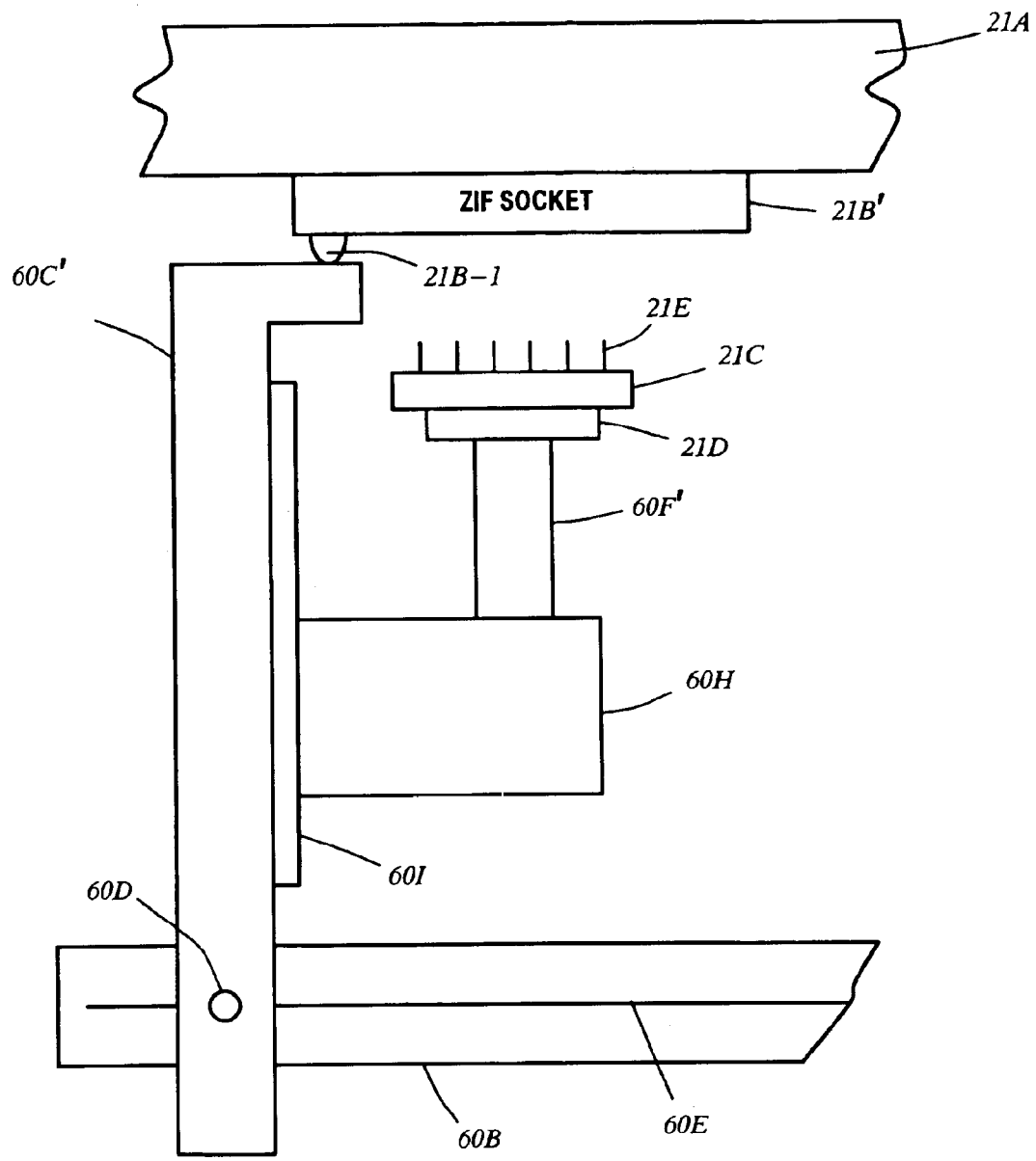
FIG. 16 shows a modification to module 60 of FIG. 2 which can be incorporated into the system of FIGS. 1, 9, 10, 11, 12 and 14.

Component 60H in FIG. 16 is a moveable carrier for the vacuum chuck 60F'. That carrier 60H travels in a guide 60I on the pivot member 60C' under the control of the master controller 70 of FIG. 2.

In FIG. 16, the changes that are made enable the chip handler mechanism to put IC-modules into, and take IC-modules out of, a particular type of socket that is a "zero insertion force" socket (ZIP socket) 21B'. The ZIP socket 21B' includes, an actuator 21B-1 which needs to be pressed in order to allow the terminals 21E on the substrate 21C to be inserted into the ZIF socket 21B' without any opposing force.

In FIG. 16, the pivot member 60C' is "L" shaped. To insert the IC-module 21C–421E into the ZIF socket 21B', the bottom portion of the "L" presses against the actuator 21B-1, as shown. After that occurs, the carrier 60H moves upward in the guide 60I until the terminals 21E are in the ZIF socket 21B'. Then the actuator 21B-1 is released by moving the arm 60E slightly downward into the base 60A of FIG. 2 while concurrently moving the carrier 60H upward by the same distance. This keeps the terminals 21E in the ZIF socket 21B' while the actuator 21B-1 is being released.

To remove the IC-module 21C–21E from the ZIF socket 21B' the following sequence of operations is performed. First, the arm 60E is moved upward until the bottom portion of the "L" shaped pivot member 60C' just barely touches the socket actuator 21B-1. Then the carrier 60H is moved upward in the guide 60I until the vacuum chuck 60F' just barely touches the IC-chip 21D. At that point, a vacuum is applied to the IC-chip 21D by the vacuum chuck 60F'. Then, the arm 60E is moved slightly upward while concurrently the carrier 60H is moved downward by the same distance. The upward movement of the aim 60E causes the bottom of the "L" shaped pivot member to press against the actuator 21B-1 and thereby release the IC-module 21C–21E from the ZIP socket 21B'.

One preferred IC-chip testing system as well as sever major modifications to that system, have now been described in detail with reference to FIGS. 1–15. In addition however, various minor modifications can be made to those systems.

For example, in the systems of FIGS. 1, 11 and 14, a total of four of the modules 21–24 which hold the IC-chips are shown. But, as a modification, total number of modules 21–24 in the systems of FIGS. 1, 11 and 14 can be increased or decreased as desired. Preferably that total number is in the range of two to twenty. Also, for each module 21–24 which is added (or deleted) a corresponding module 31–34 and a corresponding module 41–44 is added (or deleted).

As another example, in the system of FIGS. 1, 9, 10 and 11, the temperature control modules 41–44 were described as including a heat exchanger which regulated the temperature of the IC-chips 21D by thermal conduction. But as a modification, the temperature control module 41–44 can be of a type which regulates the temperature of the IC-chip 21D by spray cooling. Particular spray cooling mechanisms are described in U.S. patent application Ser. No. 10/647,091, which is assigned to the assignee of the present invention, and which is herein incorporated by reference.

Also, as another example, the state machine 21I which is shown in FIG. 5 can be structured to generate the test signals TDI as any desired bit stream. U.S. Pat. No. 6,415,409 (which is assigned to the assignee of the present invention) discloses a circuit for generating the TDI signals selectively with either stored bit streams or internally generated bit streams. Those bit streams can be so long that they provide a complete functional test of the IC-chips. Alternatively, the bit streams can be so short and simple that they merely put the IC-chips into one predetermined state while the IC-chips receive electrical power for a "burn-in" test.

Further, as another example, the container placing mechanism 50 of FIGS. 3A–3B can be expanded to include multiple pairs of the mechanisms 50N and 50J. In FIGS. 3A–3B, a single pair of the mechanisms 50N and 50J is provided; and that pair holds all of the IC-modules (in the containers 50F) that failed their test. But if multiple pairs of the mechanisms 50N and 50J are provided, then each particular pair will hold IC-modules (in the containers 50F) that had a particular type of failure in their test.

Accordingly, in view of all of the above described IC-chip testing systems, it is to be understood the present invention is not limited to the details of any one particular system, but is defined by the appended claims.

What is claimed is:

1. An electromechanical system for testing IC-chips; said system being comprised of:

a total of N chip holding subassemblies, where N is as integer greater than one and where each chip holding subassembly has sockets for holding a group of IC-modules that include said IC-chips;

a moving means for automatically moving the i-th one of said N chip holding subassemblies from a load position in said system to a test position in said system, and visa-versa, where i changes with time in a sequence;

a power supply means which sends electrical power only to those IC-modules that are held by said chip holding subassemblies at said test position; and, a signal generator means which sends test signals concurrently to said IC-chips on all chip holding subassemblies that are at said test position, where said test signals are shifted in time from one subassembly to another.

2. A system according to claim 1 wherein said signal generator means begins to send said test signals to said IC-chips that are on the i-th chip holding subassembly, between the time that subassembly is moved to said test position and the time that the next chip holding subassembly in said sequence is moved to said test position.

3. A system according to claim 2 wherein said sequence in which said moving means moves said i-th chip holding subassembly in a repetitive sequence.

4. A system according to claim 2 wherein said sequence in which said moving means moves said i-th chip holding subassembly in a random sequence.

5. A system according to claim 2 wherein said moving means moves said i-th chip holding subassembly from said load position to said test position, and visa-versa, while at least half of said N chip holding subassemblies are at said test position.

6. A system according to claim 2 wherein said signal generator means includes N digital state machines, one on each of said N chip holding subassemblies, and a master controller which is stationary and is coupled via a communication channel to each of said N digital state machines.

7. A system according to claim 2 wherein said signal generator means sends test signals which place said IC-chips in a predetermined state but do not functionally test said IC-chips.

8. A system according to claim 2 wherein said signal generator means sends test signals which functionally test said IC-chips.

9. A system according to claim 2 which further includes a chip handler means, which is time-shared by all of said chip holding subassemblies, for moving said IC-modules from one source container into the sockets on said i-th chip holding subassembly at said load position, and from those sockets to at least one pass container and one fail container.

10. A system according to claim 9 which further includes a means for automatically replacing any one of said containers when chip handler means has emptied or filled that container with said IC-modules.

11. A system according to claim 9 wherein each socket on said chip holding subassembly faces downward at said load and test position, and said chip handler means flips each IC-module 180° from an initial position where said electrical terminals face downward.

12. A system according to claim 2 wherein each chip holding subassembly is manually removable from said system at said load position, and manually returnable to said system at said load position.

* * * * *